United States Patent [19]

Fujiu et al.

[11] Patent Number: 5,537,863
[45] Date of Patent: Jul. 23, 1996

[54] SCANNING PROBE MICROSCOPE HAVING A CANTILEVER USED THEREIN

[75] Inventors: Takamitsu Fujiu, Zama; Shunji Watanabe, Setagaya-ku; Tatsushi Nomura, Kawasaki; Toru Fujii, Yamato; Yoshinori Sango, Machida, all of Japan

[73] Assignee: Nikon Corporation, Japan

[21] Appl. No.: 276,021

[22] Filed: Jul. 15, 1994

[30] Foreign Application Priority Data

| Jul. 15, 1993 | [JP] | Japan | 5-175368 |
| Jul. 22, 1993 | [JP] | Japan | 5-180532 |
| Jul. 22, 1993 | [JP] | Japan | 5-180534 |
| Mar. 11, 1994 | [JP] | Japan | 6-040227 |

[51] Int. Cl.$^6$ .................................. G01B 5/28
[52] U.S. Cl. .................................. 73/105; 73/866.5
[58] Field of Search .................. 73/105, 866.5, 73/862.634, 862.639, 774, 777, DIG. 4; 250/306; 310/331, 332, 367, 368

[56] References Cited

U.S. PATENT DOCUMENTS

| 4,894,538 | 1/1990 | Iwatsuki et al. | 250/306 |
| 5,047,637 | 9/1991 | Toda | 73/105 |
| 5,066,358 | 11/1991 | Quate et al. | 250/306 |
| 5,107,114 | 4/1992 | Nishioka et al. | 73/105 |
| 5,136,162 | 8/1992 | Miyamoto et al. | 250/306 |
| 5,231,286 | 7/1993 | Kajimura et al. | 250/306 |
| 5,245,863 | 9/1993 | Kajimura et al. | 73/105 |
| 5,268,571 | 12/1993 | Yamamoto et al. | 250/306 |
| 5,276,672 | 1/1994 | Miyazaki et al. | 73/105 |
| 5,321,685 | 6/1994 | Nose et al. | 250/306 |
| 5,334,835 | 8/1994 | Nakayama et al. | 250/307 |

FOREIGN PATENT DOCUMENTS

| 0290648(A) | 11/1988 | European Pat. Off. |
| 1-262403(A) | 10/1989 | Japan. |
| 350510 | 12/1992 | Japan | 73/105 |
| 5-26662(A) | 2/1993 | Japan. |

OTHER PUBLICATIONS

Hirofumi Yamada, "Atomic Force Microscope", *Applied Physics*, vol. 59, pp. 59–60 (1990).

Keiji Takata, "Novel Method for Detecting Resonant Frequency Shift in Atomic Force Microscopy", *Jpn. J. Appl. Phys.*, vol. 32, pp. 2455–2458 (May 1993).

*Primary Examiner*—Hezron E. Williams
*Assistant Examiner*—Daniel S. Larkin
*Attorney, Agent, or Firm*—Pennie & Edmonds

[57] ABSTRACT

A scanning probe microscope according to present invention comprises a cantilever for interaction with a surface, the cantilever having a self vibrator therein for vibrating the cantilever, the cantilever having a self strain detector therein. The self vibrator and self strain detector comprise a piezoelectric layer and electrodes, and the piezoelectric layer is disposed between these electrodes.

59 Claims, 28 Drawing Sheets

SCANNING PROBE MICROSCOPE HAVING A CANTILEVER USED THEREIN

BACKGROUND OF THE INVENTION

1. Field of the Invention

The present invention relates to a scanning probe microscope. More particularly, the invention relates to an atomic force microscope (AFM), which is among scanning probe microscopes, and to a cantilever used therein.

2. Related Background Art

AFM (atomic force microscope) has a cantilever. As a measured sample approaches the cantilever, a force from the measured sample is exerted on the cantilever. The cantilever receiving the force is then deflected. Detecting an amount of the deflection, the force can be detected. If the measured sample is two-dimensionally moved relative to the cantilever, the cantilever receives the force changing in synchronization with the movement. Then, detecting the force synchronized with the movement, an image of the surface of the measured sample can be obtained.

SUMMARY OF THE INVENTION

The present invention concerns scanning probe microscopes including atomic force microscopes (AFM) and scanning tunneling microscopes (STM). A surface of a sample is investigated with the scanning probe microscope. The microscopes of the present invention are characterized by a cantilever used therein. The scanning probe microscope comprises a cantilever for interaction with said surface, said cantilever having a self vibrator therein for vibrating said cantilever. More precisely, the cantilever itself vibrates in the direction of the thickness thereof when an ac voltage is applied to the cantilever. In addition, the cantilever can be arranged to extract a signal concerning an amount of strain thereon or an amount of displacement thereof from electrodes set on the cantilever.

The cantilever has a first portion and a second portion, said cantilever is fixed at said first portion, and said self vibrator is provided at least in said second portion. The self vibrator comprises a first layer of piezoelectric crystal, a first electrode formed on said first layer, and a second electrode formed on said first layer so that said first layer is located between said first electrode and second electrode. The cantilever also comprises a strain detector therein for detecting a strain of said cantilever using piezoelectric effect.

The self strain detector is formed on said self vibrator. The self strain detector comprises: a second layer of a piezoelectric crystal; a third electrode formed on said second layer; and a fourth electrode formed on said second layer so that said second layer is located between said third electrode and said fourth electrode.

More precisely, a scanning probe microscope comprises a microscope main body having a sample table and a cantilever having a first end portion and a second end portion, and the first end portion is set on the microscope main body. The second end portion has a pointed portion, and the pointed portion is arranged to relatively move with respect to the sample table. The cantilever comprises a plate disposed between the first end portion and the second end portion, and the plate can be deflected in a direction of the thickness thereof. The plate comprises the self strain detector for detecting a strain of the plate by itself and the self vibrator for vibrating the plate by itself in the direction of the thickness or in the direction of the first electrode to second electrode.

The plate further comprises a first insulator layer disposed between the second electrode of the self vibrator and the third electrode of the self strain detector, in order to electrically separate the second electrode from the third electrode.

The microscope main body of the scanning probe microscope further comprises an actuator. The actuator changes a positional relationship between the cantilever and the sample table with application of a voltage to the actuator. The actuator may be constructed of a tube type piezoelectric device. Driving the actuator, a probe as the pointed portion two-dimensionally scans the surface of the sample. Since a force acts between the pointed portion and atoms forming the sample surface, the plate of cantilever is deflected. Detecting an amount of deflection of the plate, a gap can be measured between the atoms and the pointed portion as the probe of cantilever. Two-dimensionally plotting measured gaps, an image of the sample surface can be measured at the atomic level.

The ac voltage from power supply is applied between the first electrode and the second electrode. With application of the ac voltage the cantilever vibrates in the direction of the thickness thereof. Applying the voltage to the electrodes, an amount of deflection of the plate is detected as an ac signal from the first and second electrode. In other words, a signal concerning the amount of deflection of the cantilever as extracted from the first electrode and the second electrode is input into a signal processing unit. The signal processing unit converts the ac signal into a signal having information on a gap between the pointed portion of the cantilever and the sample.

The plate further comprises a second insulator layer formed on the fourth electrode of the self strain detector so that the fourth electrode is disposed between the second layer and the second insulator layer. The second insulator increase the mechanical strength of the cantilever. The second insulator layer can be formed on the vibrator so that the first electrode is disposed between the first layer and the second insulator layer.

The first layer or the second layer is made of a material containing either one of lead titanate zirconate-lanthanum oxide, lead magnesium niobate-lead titanate, and barium titanate.

Further, the second insulator layer may be made of a material containing silicon nitride and the pointed portion (probe) may be made of a material containing silicon dioxide, which is advantageous in fabricating the cantilever. Namely, a silicon substrate is first prepared, and the substrate is reacted with nitrogen atoms, to form a silicon nitride film or layer on the silicon substrate. Then a local region of silicon nitride is etched into the silicon substrate, and the silicon substrate is further etched in the exposed region by the etching, forming a pore (pit) on the surface of the silicon substrate. Silicon dioxide is formed on the inner wall by oxidizing the inner wall on the pore. Further, the silicon substrate is removed by etching, whereby the pointed portion probe of silicon dioxide can be formed.

If the first layer or second layer is made of a material containing lead, the first layer and second layer will react with the first insulator or the second insulator layer. This reaction is not desired in respect of characteristics of the cantilever. The plate forming the cantilever further comprises a first buffer layer disposed between the first insulator layer and the second layer.

The second insulator layer is, for example, silicon nitride. If the second layer is made of a material containing lead, it is preferred that the plate further comprises a second buffer layer disposed between the second insulator layer and the second layer. The first or second buffer layer is made of a material containing either one of aluminum oxide, magnesium oxide, or chromium oxide.

Taking into consideration the electric resistance and the reactivity with the first layer or the second layer, it is desired that the first electrode, the second electrode, the third electrode or the fourth electrode is made of a material containing platinum, which has low reactivity with the piezoelectric material and relatively high electric conductivity among the metals.

Further, a cantilever according to the present invention comprises a substrate made of a material containing silicon, for example, silicon or silicon nitride. The substrate has a pointed portion for detecting a force acting between the atom forming the sample surface and the pointed portion. The cantilever comprises a first layer of piezoelectric crystal formed on the substrate made of a material containing lead. The first electrode is disposed between the substrate and the first layer, and the first electrode is made of a material containing platinum. The platinum reacts with neither the first layer containing lead or the substrate containing silicon at room temperature. Therefore, the first electrode suppresses a interaction of said substrate and said first layer. Still, the cantilever comprises a second electrode formed on the first layer so that the first layer is disposed between the first electrode and the second electrode. The cantilever may comprise a buffer layer disposed between the first layer and the said substrate, and the buffer layer is made of a material containing either one of aluminum oxide, magnesium oxide, or chromium oxide.

Further, the first electrode or the fourth electrode contacted with silicon is preferably made of the material further containing titanium or tantalum. The use of titanium or tantalum enhances resistance to peeling-off from the silicon substrate or layer. Also, the use of titanium or tantalum can prevent silicon atoms from penetrating the first electrode or fourth electrode to mix into the first layer or second layer in fabrication steps of the cantilever.

The self vibrator of the present invention may have another arrangement (arrangement A). Namely, the self vibrator may have a third electrode formed on the first layer so that the first layer is disposed between the first electrode and the third electrode. In this arrangement, the plate may comprise an insulator layer formed on the second electrode so that the first electrode is disposed between the first layer and the insulator layer.

The microscope may further comprise an actuator for moving the cantilever relative to the sample table, a power supply for applying an ac voltage between the first electrode and the second electrode, or a signal processing unit for processing a signal concerning an amount of a strain of the cantilever, as extracted from the first electrode and the third electrode.

The first layer is made of a material containing either one of lead titanate zirconate-lanthanum oxide, lead magnesium niobate-lead titanate, or barium titanate.

Similarly as above, the buffer layer can also be used in case of the self vibrator of this arrangement being used.

In the arrangement A, the plate may further comprise a fourth electrode. The fourth electrode is formed on the first layer so that the first layer is disposed between the first electrode and the fourth electrode and that the first electrode is disposed between the third electrode and the fourth electrode. In this arrangement, the third electrode is sandwiched between the second electrode and the fourth electrode. Applying the ac voltage to the first electrode to vibrate the cantilever and using the pair of third electrode and fourth electrode to extract a signal, the signal can be attained with high detection accuracy. Still, the second electrode is connected to ground. Specifically defining the positions of the electrodes, the first electrode, the third electrode, and the fourth electrode are arranged in a same plane but the first electrode, the second electrode, and the third electrode are not arranged in a same plane.

If the first layer is set through the second electrode on the silicon layer, it is desirable that the second electrode comprises a platinum layer, the platinum layer being formed on the first layer, and a titanium layer. The titanium layer is formed on the platinum layer so that the platinum layer is disposed between the first layer and the titanium layer. The titanium layer functions as barrier metal for restricting the diffusion of silicon atoms from the silicon layer into the first layer. The adhesion between the titanium layer and the silicon layer is higher than that between the silicon layer and the platinum layer. If the titanium layer is interposed between the platinum layer and the silicon substrate, the platinum layer and the silicon substrate become resistant to peeling-off.

Also, the second electrode may comprise a platinum layer, the platinum layer being formed on the first layer, and a tantalum layer. The tantalum layer is formed on the platinum layer so that the platinum layer is disposed between the first layer and the tantalum layer. The tantalum layer has the same function (increasing the adhesion therebetween) as the titanium layer. Since the tantalum is unlikely to form silicide, the use of tantalum is effective. The thickness of the tantalum or titanium layer is preferably not less than 10 nanometers taking the adhesion into account. Taking the diffusion of silicon into consideration, the thickness is preferably not less than 100 nanometers. Further, the thickness of the platinum layer is preferably not less than 20 nanometers for growth of the first layer. The thickness of the platinum layer is preferably not less than 200 nanometers for stress relaxation between the first layer and the silicon substrate.

The scanning probe microscope of the present invention further comprises impedance measuring means for measuring an impedance of the first layer, wherein the self vibrator shares the first layer, the first electrode, and the second electrode with the self strain detector. The microscope may comprise a power supply for applying an ac voltage between the first electrode and the second electrode. The frequency of the ac voltage is close to a resonance frequency of the cantilever to such an extent that the impedance of the first layer changes when the cantilever receives a force. The impedance measuring means is connected between the first electrode and the second electrode to detect the impedance between the first electrode and the second electrode.

The microscope may further comprise an actuator electrically connected to the impedance measuring means, for moving the measured sample in a direction in which the cantilever is displaced with application of the ac voltage; and actuator controlling means for controlling the actuator so that the impedance measured by the impedance measuring means is kept constant, so as to move the measured sample. In this case, the first layer constitutes a part of a feedback circuit. In the above cantilever, it is preferable that the first layer is crystallographically oriented.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
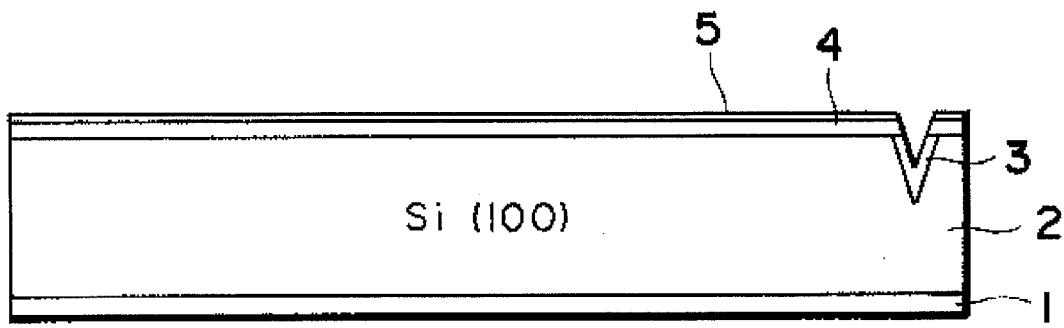
FIG. 1 is a cross section of a cantilever intermediate to illustrate a step for fabricating a cantilever.

The present invention will be described in detail as to preferred embodiments of scanning probe microscope with reference to the accompanying drawings. In the description, like elements will be denoted by same reference numerals and redundant description will be avoided. Although scanning probe microscopes in the following description are atomic force microscopes, it should be noted that the below-described microscopes can be also applied to scanning tunneling microscopes.

First described is a cantilever, which is a probe for atomic force microscope. The cantilever is produced using the method shown in FIG. 1 thru FIG. 4. As shown in FIG. 1, silicon nitride layers 1, 4 are first formed by the chemical vapor deposition (CVD) process on two surfaces perpendicular to the direction of the thickness of (100) silicon (Si) substrate 2. One silicon nitride layer 4 is etched in a region at one end thereof by the reactive dry etching method. A pore is formed by the etching in the depth a little deeper than the thickness of silicon nitride layer 4. This means that the silicon nitride layer 4 is etched before the pore is formed ranging from the surface into the silicon substrate 2. The silicon substrate 2 is further etched by anisotropic etching using potassium hydroxide in the region exposed by the etching of silicon nitride layer 4, so that the silicon substrate 2 has a pit in this region. The depth of the pit is shallower than the thickness of silicon substrate 2. Silicon substrate 2 is oxidized in the pit-formed region, so that a silicon dioxide layer 3 is formed as tapered to a point toward the silicon nitride layer 1 and covering the silicon substrate 2 in this region. The silicon dioxide layer 3 is to serve as a probe 3, because the distal end thereof is pointed. Further, a platinum electrode 5 is formed on the silicon nitride layer 4 using the photolithography technology. The platinum layer 5 is disposed between the silicon nitride substrate or layer 4 and PZT layer, and the platinum layer 5 suppresses an interaction of the PZT layer 6 and silicon nitride substrate 4. In other words, the platinum layer reacts with neither the silicon nitride substrate 4 or PZT layer 6 at room temperature, and improves the characteristics of the cantilever.

Figure 2:
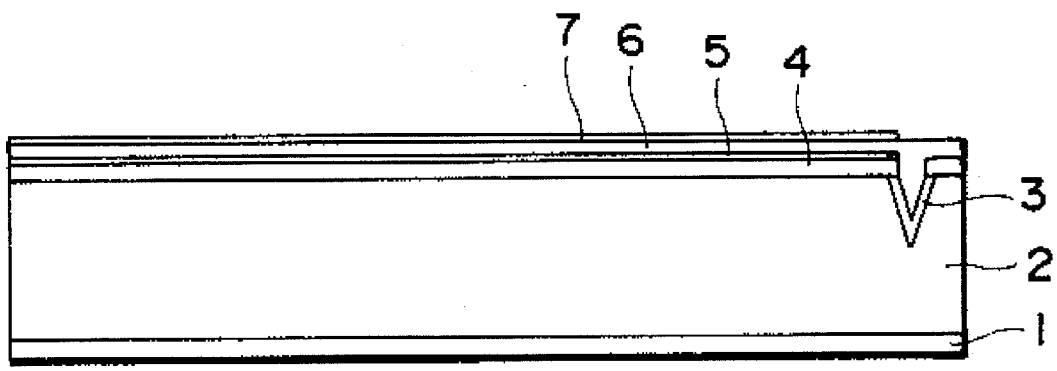
FIG. 2 is a cross section of a cantilever intermediate to illustrate a step for fabricating the cantilever.

Lead zirconate titanate (PZT) layer 6 is next formed on the platinum electrode 5 in the thickness of 0.5 micron (micrometer) by the sputtering method, as shown in FIG. 2. Platinum electrode 7 is further formed on the PZT layer 6 by the photolithography technology.

Figure 3:
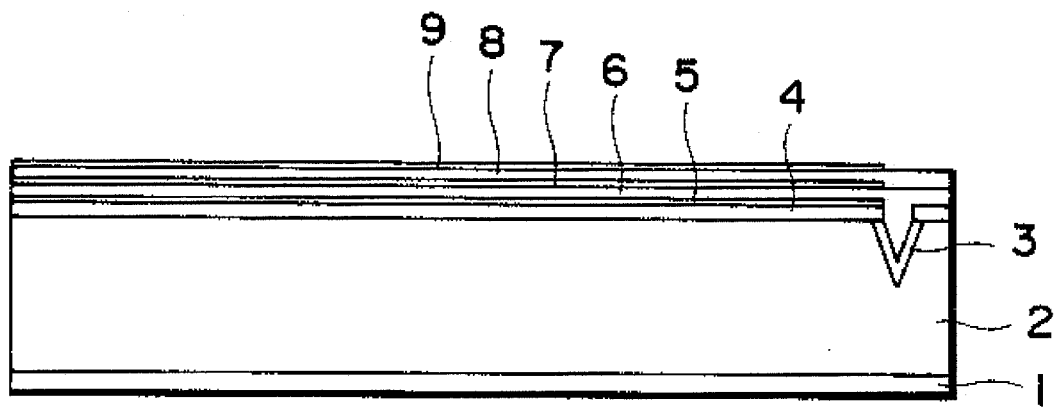
FIG. 3 is a cross section of a cantilever intermediate to illustrate a step for fabricating the cantilever.

Silicon nitride layer 8 is next formed on the platinum electrode 7 in the thickness of 0.5 micron by the CVD process, as shown in FIG. 3. Platinum electrode 9 is further formed on the silicon nitride layer 8.

Figure 4:
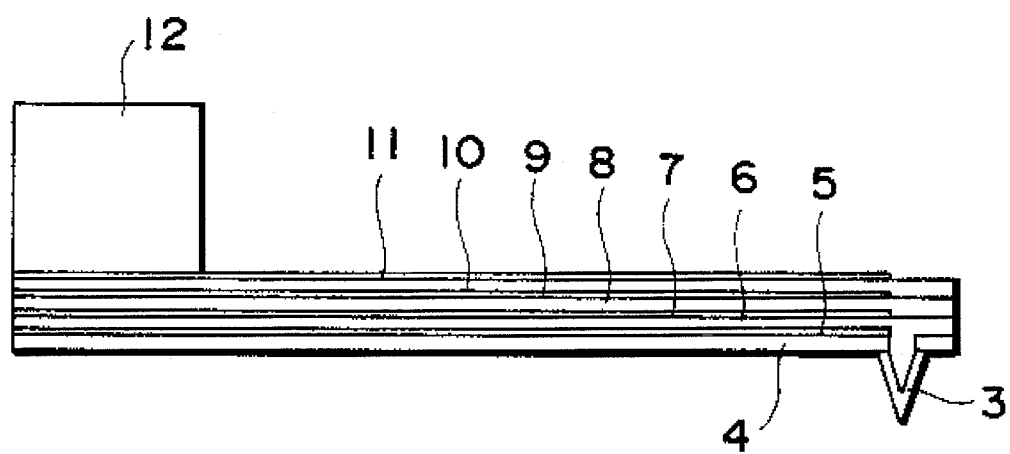
FIG. 4 is a cross section of a cantilever product to illustrate a step for fabricating the cantilever.

Lead zirconate titanate (PZT) layer 10 is next formed on the platinum electrode 9 in the thickness of 0.5 micron (micrometer) by the sputtering method, as shown in FIG. 4. Further, platinum electrode 11 is formed on the PZT layer 10 by the photolithography technology. The silicon nitride layer 1 shown in FIG. 3 is next removed by the reactive dry etching process. Further, the silicon substrate 2 shown in FIG. 3 is etched by the anisotropic etching before the silicon nitride layer 4 is exposed, thus removing the silicon substrate 2. This etching makes a surface of silicon dioxide layer 3 exposed, and the exposed layer is to function as a probe 3. Glass block 12 for chucking is electrostatically adhered onto the platinum electrode 11 on the opposite side to the probe 3. The thickness of each platinum electrode 5, 7, 9, 11 is about 50 nanometers. The contour of the cantilever is rectangular and the size is 20 microns×50 microns.

Figure 5:
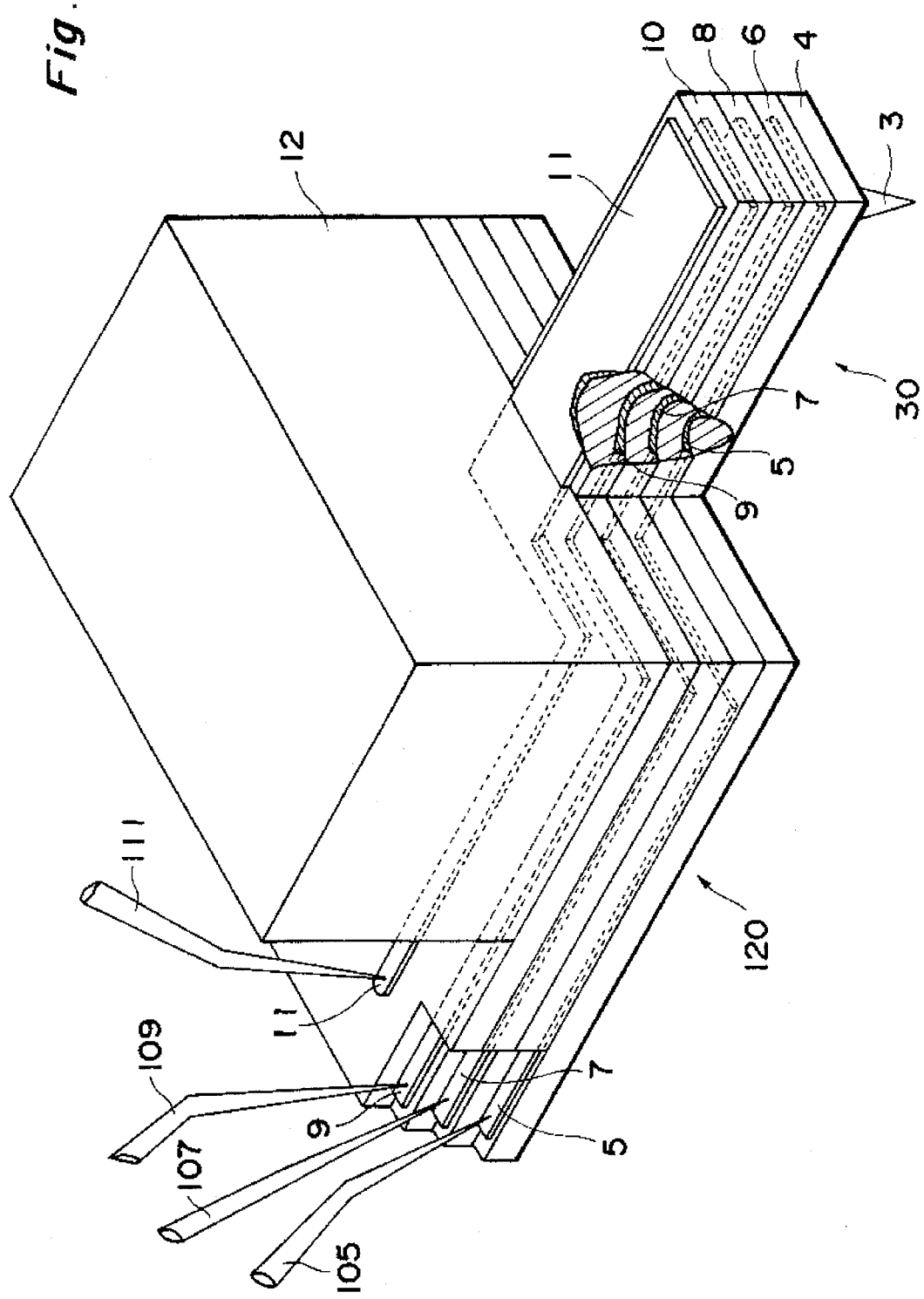
FIG. 5 is a perspective view, partly in cross section, of the cantilever shown in FIG. 4.
Figure 6:
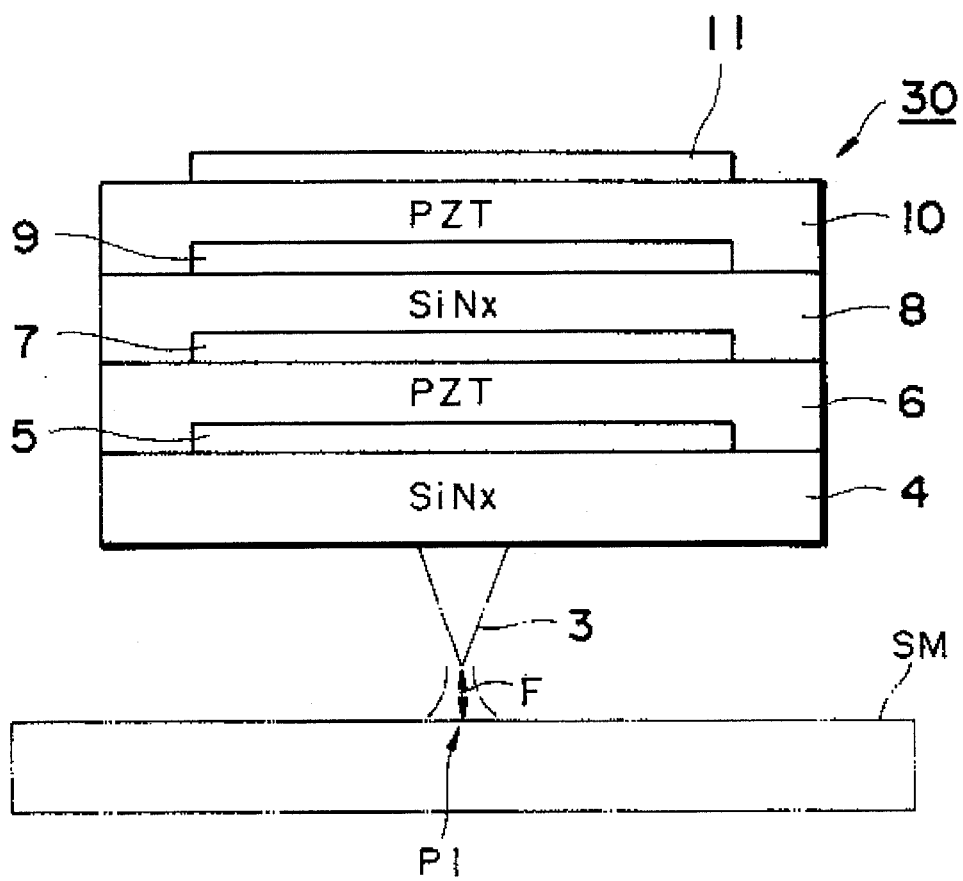
FIG. 6 is a cross sectional view of the part of the cross section in the cantilever shown in FIG. 5.

FIG. 5 is a perspective view, partly in cross section, of the cantilever shown in FIG. 4. The cantilever is composed of a cantilever body 120 as a portion where the glass block 12 is formed and a probe portion 30 as a portion where no glass block 12 is formed but the probe 3 is formed. Lead pins 105, 107, 109, 111 are electrically connected to the platinum electrodes 5, 7, 9, 11, respectively, formed in the cantilever body 120. Lead pin 109 and lead pin 107 are connected to the ground. Lead pin 111 is connected to a drive power supply not shown. Lead pin 105 is connected to a signal processing unit not shown. FIG. 6 shows a cross section of the broken part of FIG. 5. Successively deposited on the silicon nitride layer 4 are platinum electrode 5, PZT layer 6, platinum electrode 7, silicon nitride layer 8, platinum electrode 9, PZT layer 10, and platinum electrode 11. The platinum electrode 9, PZT layer 10 and platinum electrode 11 function as an actuator for vibrating the cantilever. An ac voltage is applied between platinum electrode 9 and platinum electrode 11 whereby the piezoelectric effect vibrates PZT layer 10 between the electrodes 9 and 11. The probe 3 is formed under the silicon nitride layer 4. When the probe 3 is brought closer to a first position P1 on the surface of a measured sample SM, an interatomic force works between probe 3 and sample SM. This force deflects the probe portion 30 of cantilever. Then the probe portion 30 of cantilever receives a stress. The platinum electrode 5, PZT layer 6, and platinum electrode 7 function as a displacement sensor for detecting a displacement of the cantilever. Since the PZT layer 6 is sandwiched between platinum electrode 5 and platinum electrode 7, the deflection of cantilever produces an induced voltage due to the piezoelectric effect between platinum electrode 5 and platinum electrode 7. Effecting signal processing for acoustic sonar on the induced voltage, an amount of the displacement of probe portion 30 of the cantilever can be obtained, and the stress on the probe portion 30 of cantilever can be detected.

The actuator of platinum electrode 9, PZT layer 10, and platinum electrode 11 may be used as a displacement sensor for extracting the signal while the platinum electrode 5, PZT layer 6, and platinum electrode 7 are arranged to function as an actuator with application of ac voltage. In other words, these actuator and displacement sensor can mutually exchange their functions depending upon applications.

Figure 7:
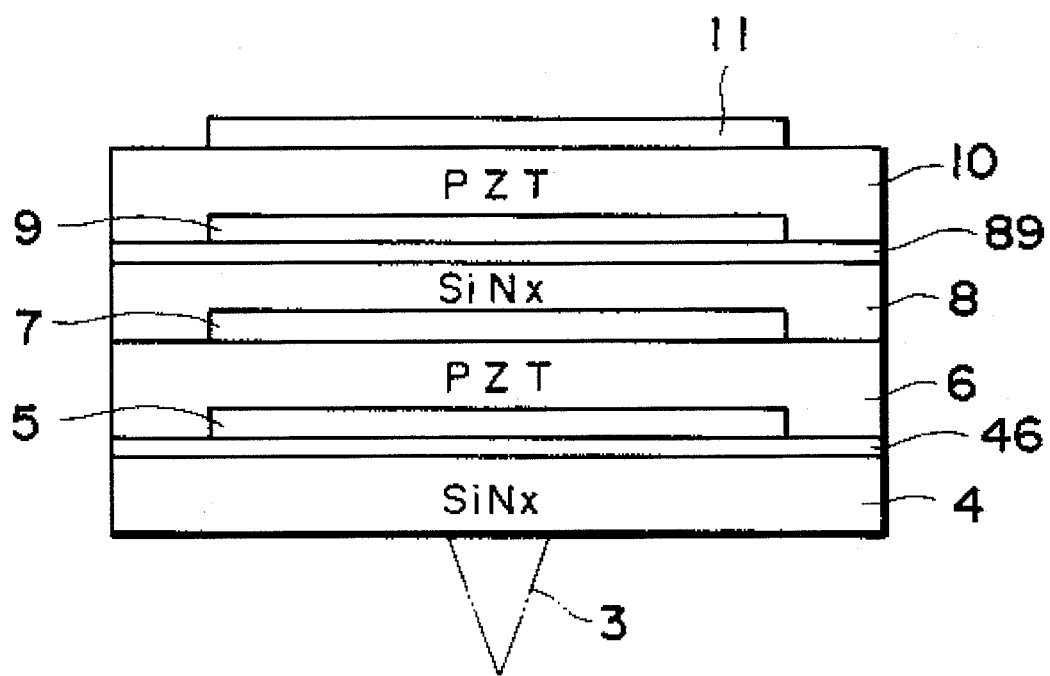
FIG. 7 is a cross sectional view of a cantilever drawn by the same method of expression as FIG. 6.

FIG. 7 shows a modification of the layer structure of the cantilever shown in FIG. 6. PZT is a material abundant in reactivity, which readily reacts with silicon or silicon nitride. This reaction is not favorable for accurate detection of interatomic force. Therefore, a buffer layer 46 is interposed between silicon nitride layer 4 and PZT layer 6. Further, a buffer layer 89 is also interposed between silicon nitride layer 8 and PZT layer 10. A material for the buffer layers may be selected from oxides such as aluminum oxide, magnesium oxide, magnesium aluminate, or chromium oxide.

Figure 8:
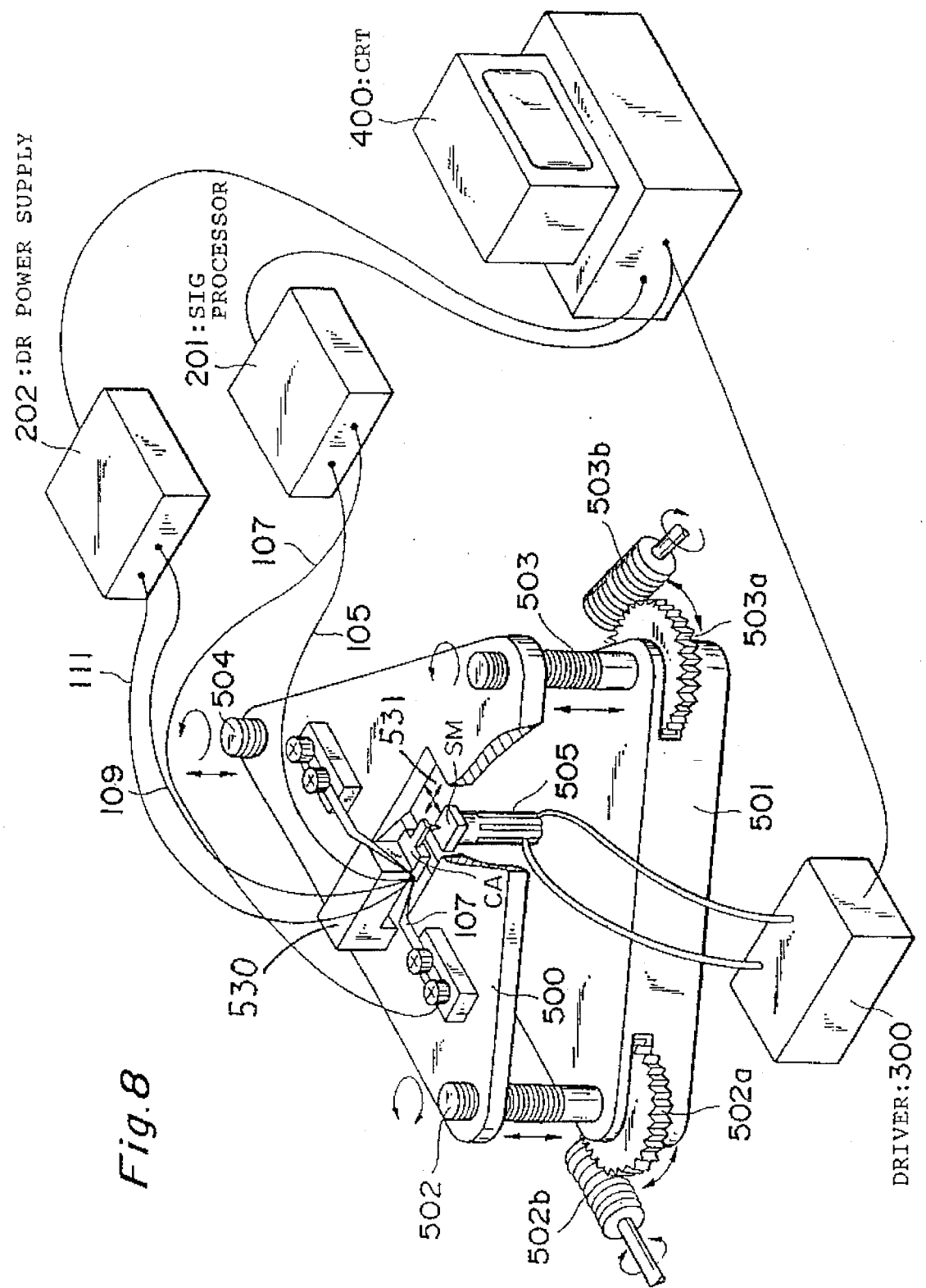
FIG. 8 is a perspective view, partly in cross section, of an atomic force microscope according to the present invention.

FIG. 8 is a perspective view, partly in cross section, to show the structure of an atomic force microscope using the cantilever CA shown in FIG. 1 thru FIG. 7. There are a triangular upper plate 500 and a triangular lower plate 501 opposed to each other. A rectangular hole 531 is formed nearly at the center of upper plate 500 therethrough in the direction of the thickness. A holding member 530 is fixed on the upper surface of upper plate 500. The holding member 530 extends from the surface of upper plate 500 to above the through hole 531, and a hole for the glass block 12 to be fit therein is formed in the lower surface of holding member 530 above the through hole 531. The glass block 12 of cantilever CA is set in the hole, so that the cantilever CA is fixed on the holding member 530 with the distal end of probe 3 being directed downward.

Three holes are formed near the corners of triangular upper plate 500 to penetrate through the microscope main body upper plate 500 in the direction of the thickness. A thread is cut on the inner surface of each hole. Worm 502, 503, 504 is set through each of the three through holes. The lower end of worm 502, 503, 504 is set in the lower plate 501 so as to be axially movable. Gear 502a, 503a is set on the circumference of worm 502, 503, respectively. Another gear is set on the circumference of worm 504. Gear 502a is in mesh with worm 502b. Rotating the worm 502b, the worm 502 rotates to adjust a gap between upper plate 500 and lower plate 501. Since a plane can be specified by three points, the orientation of upper plate 500 can be arbitrarily adjusted relative to the lower plate 501 by rotating the worms 502, 503, 504.

Lead pins 105, 107, 109, 111 are connected to the cantilever CA, as shown in FIG. 5. The lead pins 105, 107 are connected to a signal processing unit 201, and the lead pins 109, 111 to a drive power supply 202. Supplying an ac voltage from the drive power supply 202 to the cantilever CA, the cantilever CA vibrates. A measured sample SM is set below the probe 3 located at the fore end of cantilever CA. The sample SM is set on a tube actuator 505, and the tube actuator 505 serves as a sample table. The actuator 505 moves in a three-dimensional space when a voltage is applied thereto. The actuator 505 is connected to a drive control unit 300. A signal from the drive control unit 300 drives the actuator 505 to move the sample set on the actuator 505 in a three-dimensional space. Thus, the sample SM is moved relative to the cantilever CA, so that the probe 3 of cantilever CA scans the surface of sample SM. Processing a signal from cantilever CA by the signal processing unit 201, a two-dimensional image of sample surface can be observed. The two-dimensional image of sample is indicated on a display of computer 400. The computer 400 is connected to drive power supply 202, signal processing unit 201, and drive control unit 300, controlling the system of atomic force microscope.

Figure 9:
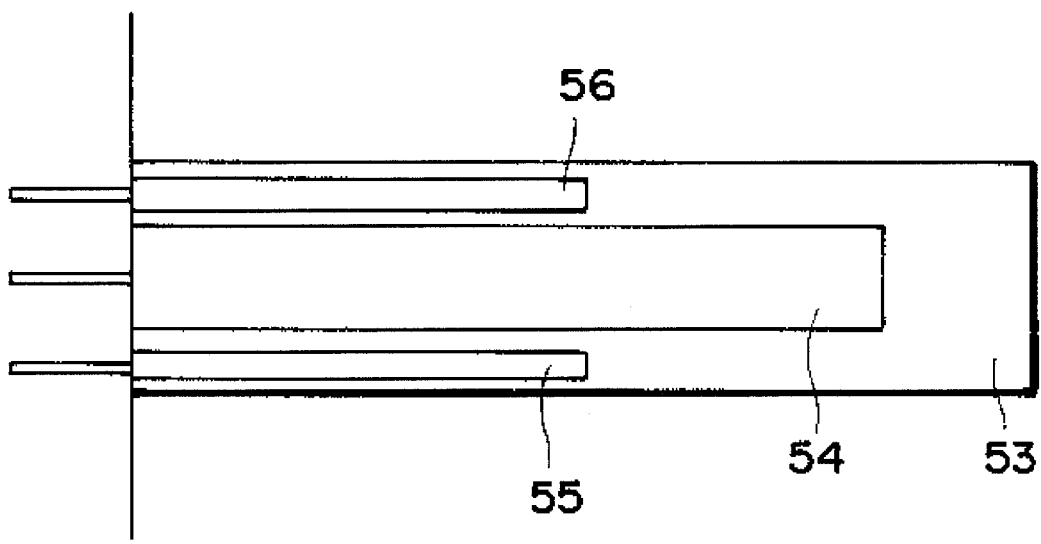
FIG. 9 is a plan view of a cantilever.
Figure 10:
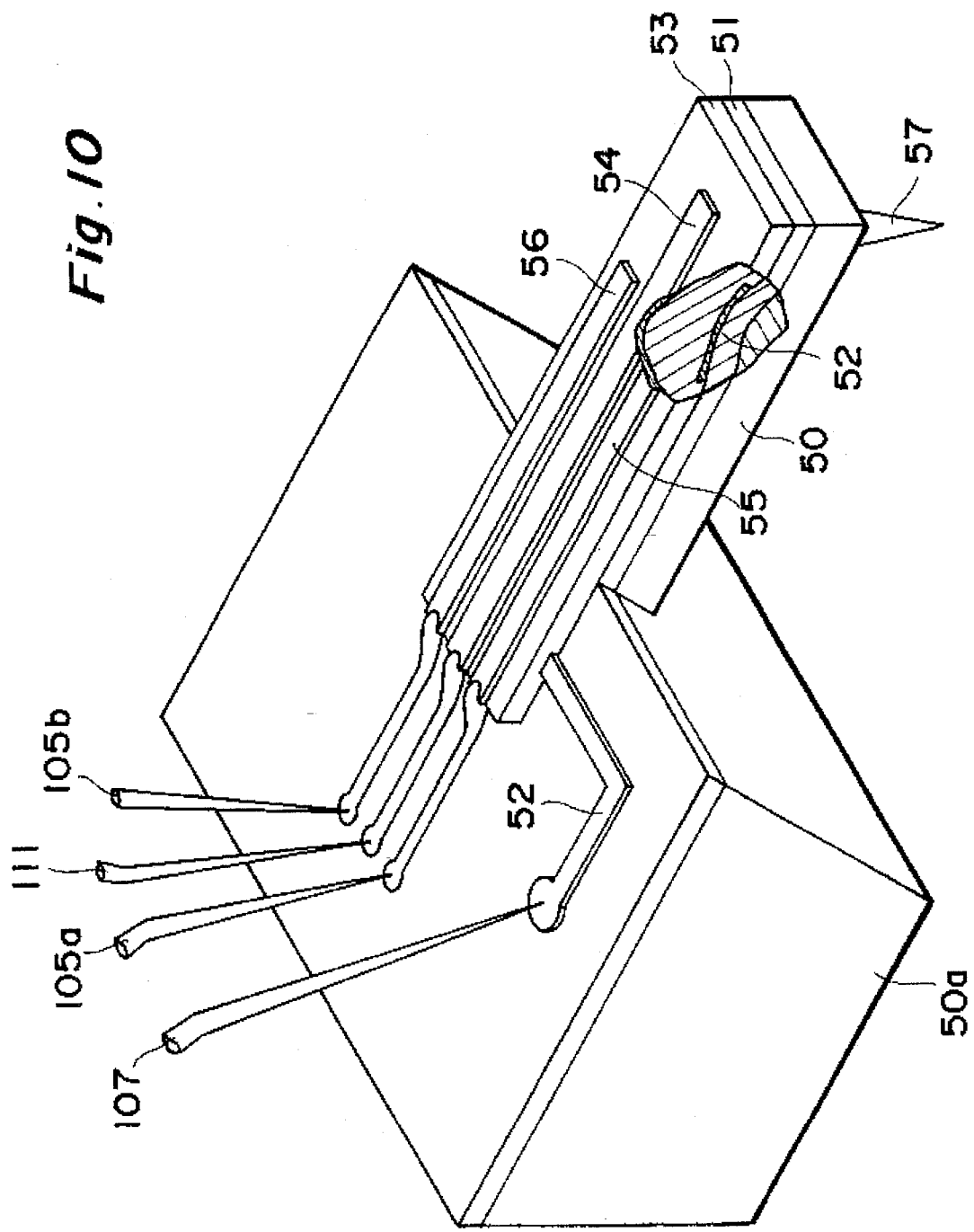
FIG. 10 is a perspective view, partly in cross section, of the cantilever shown in FIG. 9.
Figure 11:
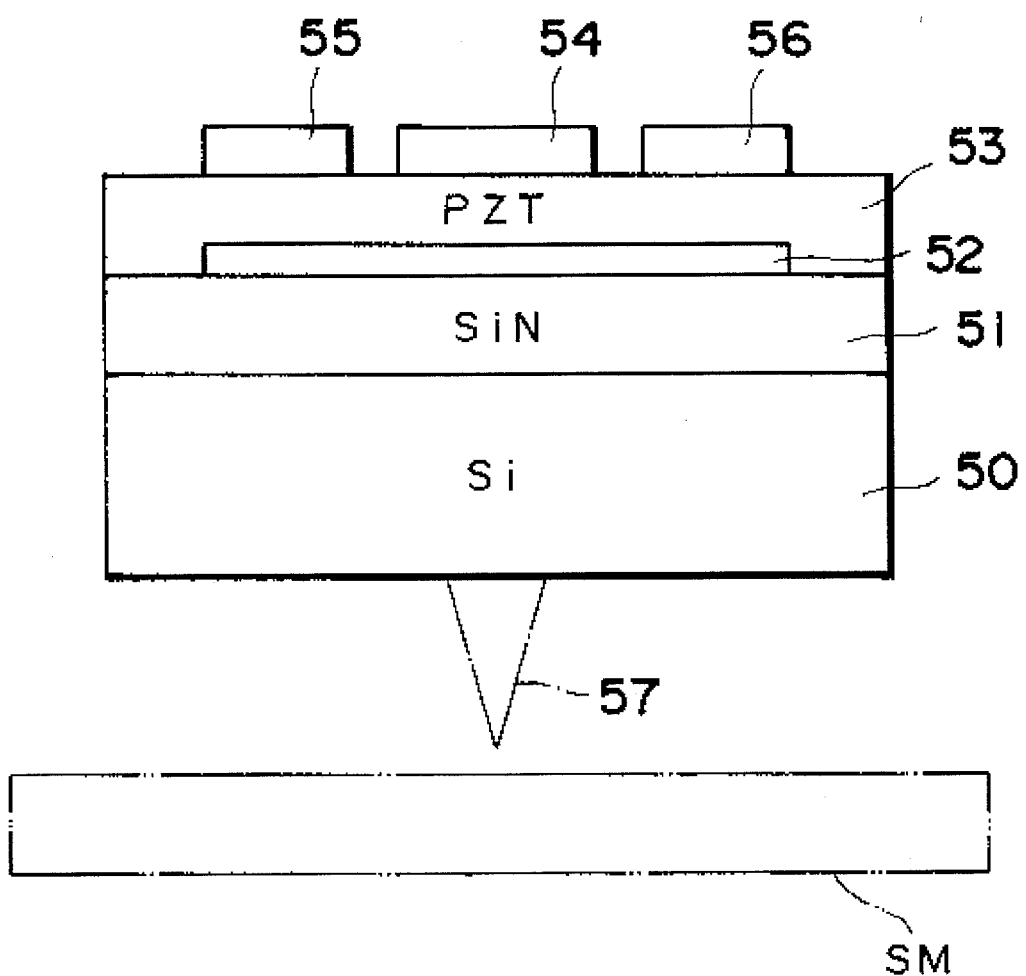
FIG. 11 is a cross sectional view of the part of the cross section in the cantilever shown in FIG. 10.

FIG. 9 is a plan view of a cantilever used in atomic force microscopes. This cantilever is a modification of the cantilever shown in FIG. 5. FIG. 10 is a perspective view, partly in section, of the cantilever shown in FIG. 9. FIG. 11 is a cross sectional view of the broken part in FIG. 10. Silicon nitride layer 51, platinum electrode 52, and PZT layer 53 are formed on silicon substrate 50. Platinum electrodes 54, 55, 56 are formed on PZT layer 53 so as to extend in the longitudinal direction of the cantilever. These platinum electrodes 54, 55, 56 are arranged in parallel with each other. The platinum electrode 54 is located between platinum electrodes 55 and 56. A probe 57 of silicon dioxide is formed on the lower surface of silicon substrate 50. Platinum electrodes 52, 55, 54, 56 are connected to lead pins 107, 105a, 111, 105b, respectively. The lead pin 107 is connected to the ground while the lead pins 105a and 105b to a signal processing unit not shown. Also, the lead pin 54 is connected to a drive power supply not shown. When an ac voltage is applied between lead pins 54 and 52, the cantilever vibrates because of the piezoelectric effect. As the probe 57 is brought closer to a measured sample SM, an interatomic force works between probe 57 and sample SM, deflecting the cantilever. The deflection of cantilever produces an induced voltage based on the piezoelectric effect between platinum electrodes 55, 56 and 52. Measuring the induced voltage, an amount of the deflection of cantilever can be known. Since an amount of the deflection of cantilever corresponds to a three-dimensional configuration of atoms on the surface of measured sample, the signal processing unit can convert the amount of deflection into information about configuration of atoms.

Figure 12:
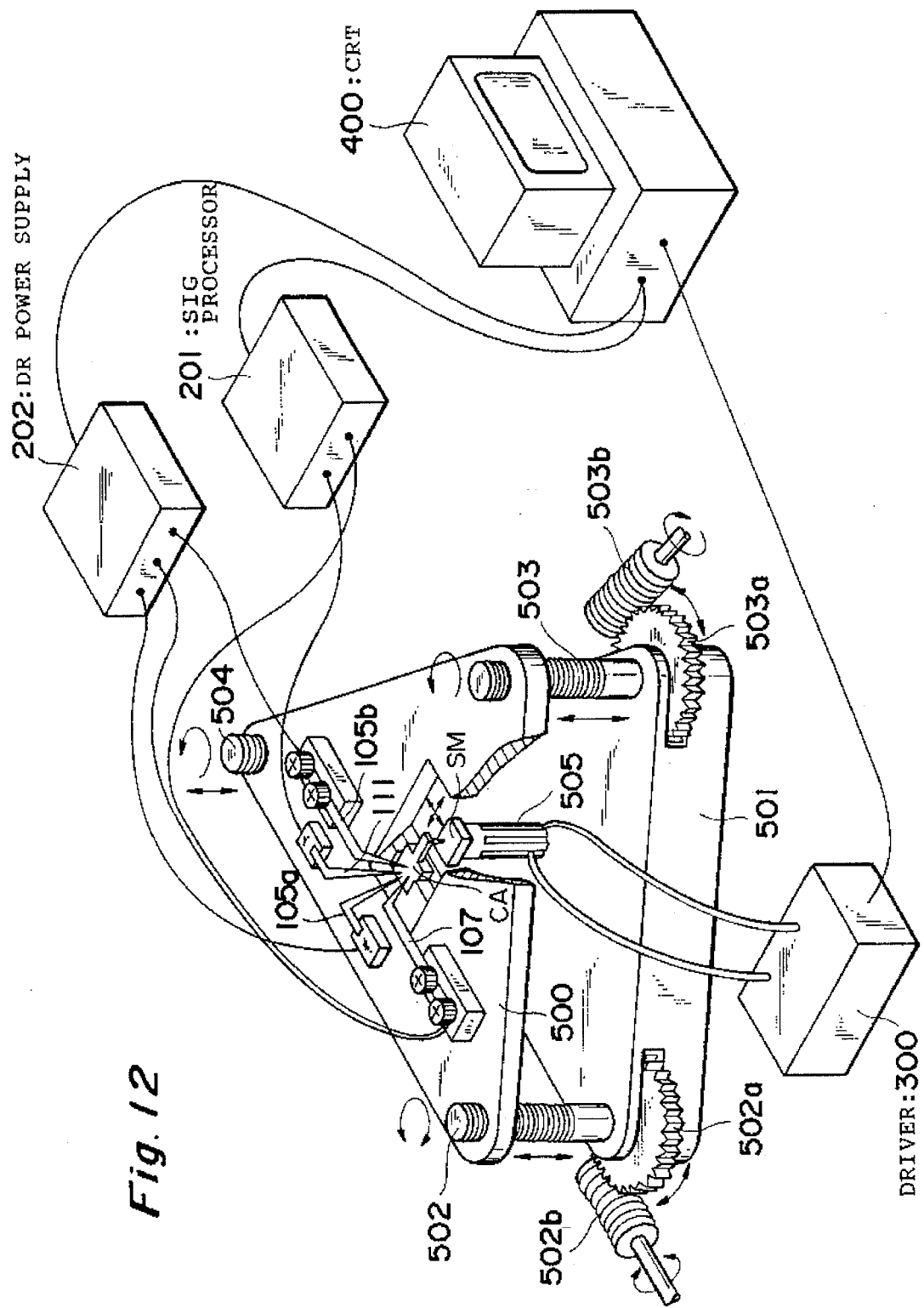
FIG. 12 is a perspective view, partly in cross section, of an atomic force microscope according to the present invention.

FIG. 12 is a perspective view to show an atomic force microscope using the cantilever. This system of microscope is substantially the same as the atomic force microscope shown in FIG. 8 except for the shape of the cantilever and the way of connection of the lead pins. Other elements in this microscope are the same as those in the microscope shown in FIG. 8. The lead pin 107 shown in FIG. 10 is connected to the ground, and the lead pin 111 to the drive power supply 202. An ac voltage is supplied from the drive power supply 202 to the lead pin 111. Lead pins 105a, 105b are connected to the signal processing unit 201. A signal from the cantilever is input into the signal processing unit 201, where the same signal processing as that for acoustic sonar is carried out. An image of the surface of sample SM is indicated on computer 400.

Figure 13:
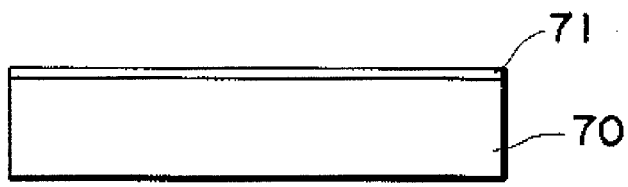
FIG. 13 is a cross sectional view of a cantilever intermediate to illustrate a step for fabricating a cantilever.
Figure 14:
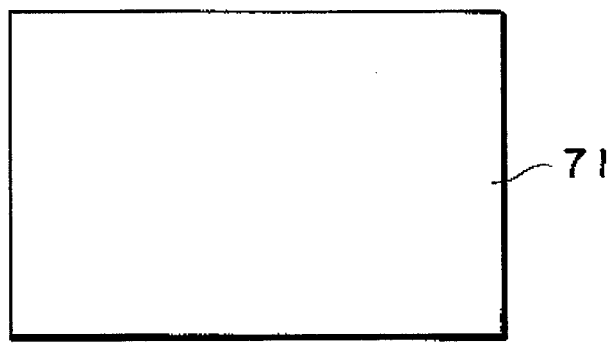
FIG. 14 is a plan view of the cantilever intermediate shown in FIG. 13.
Figure 15:
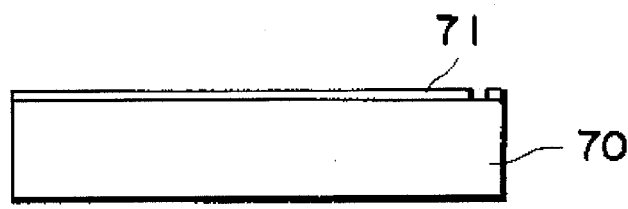
FIG. 15 is a cross sectional view of a cantilever intermediate to illustrate a step for fabricating the cantilever.
Figure 16:
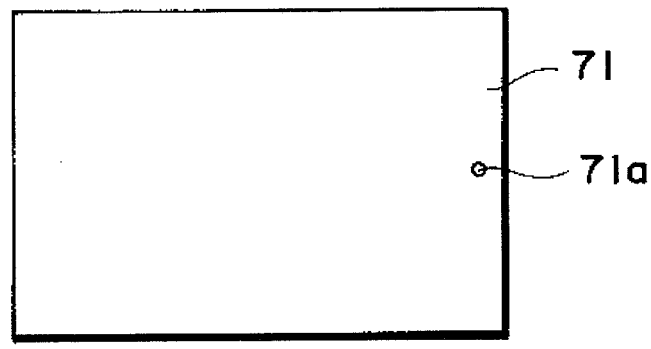
FIG. 16 is a plan view of the cantilever intermediate shown in FIG. 15.
Figure 17:
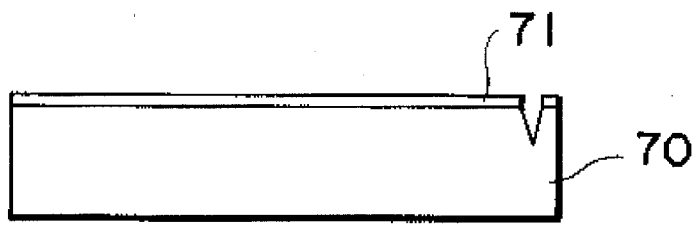
FIG. 17 is a cross sectional view of a cantilever intermediate to illustrate a step for fabricating the cantilever.
Figure 18:
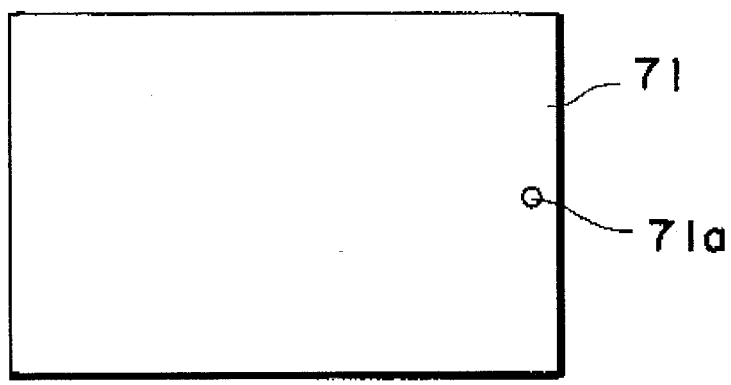
FIG. 18 is a plan view of the cantilever intermediate shown in FIG. 17.
Figure 19:
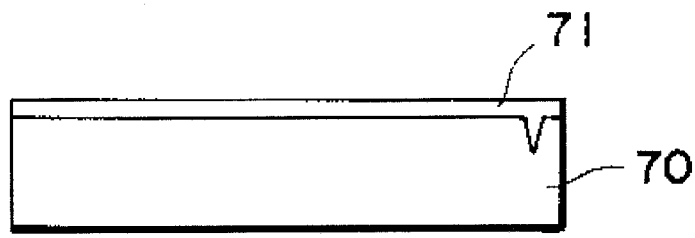
FIG. 19 is a cross sectional view of a cantilever intermediate to illustrate a step for fabricating the cantilever.
Figure 20:
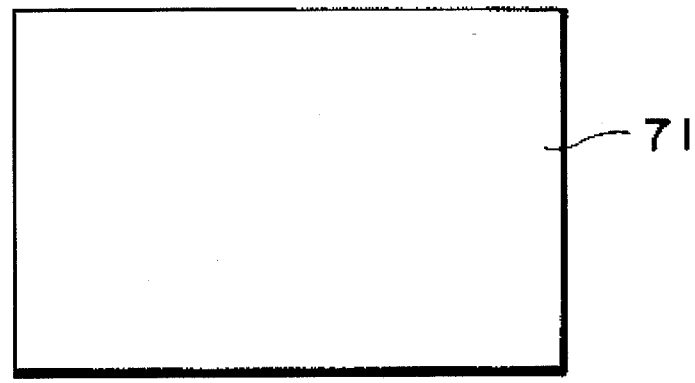
FIG. 20 is a plan view of the cantilever intermediate shown in FIG. 19.
Figure 21:
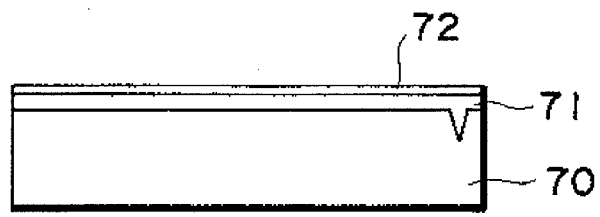
FIG. 21 is a cross sectional view of a cantilever intermediate to illustrate a step for fabricating the cantilever.
Figure 22:
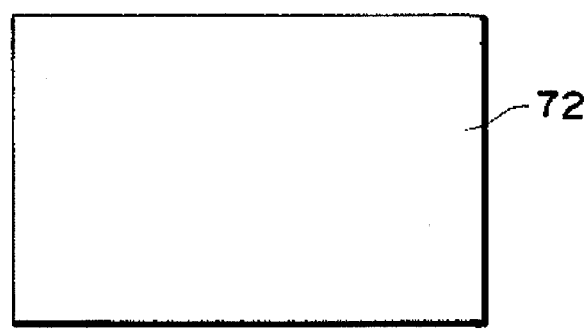
FIG. 22 is a plan view of the cantilever intermediate shown in FIG. 21.
Figure 23:
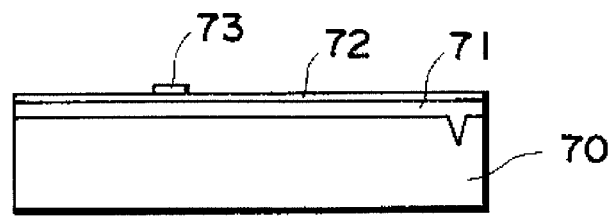
FIG. 23 is a cross sectional view of a cantilever intermediate to illustrate a step for fabricating the cantilever.
Figure 24:
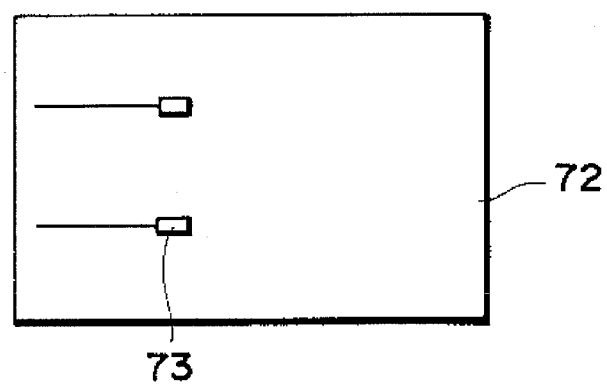
FIG. 24 is a plan view of the cantilever intermediate shown in FIG. 23.
Figure 25:
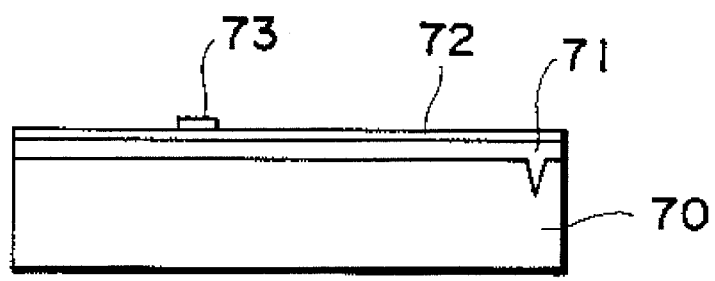
FIG. 25 is a cross sectional view of a cantilever intermediate to illustrate a step for fabricating the cantilever.
Figure 26:
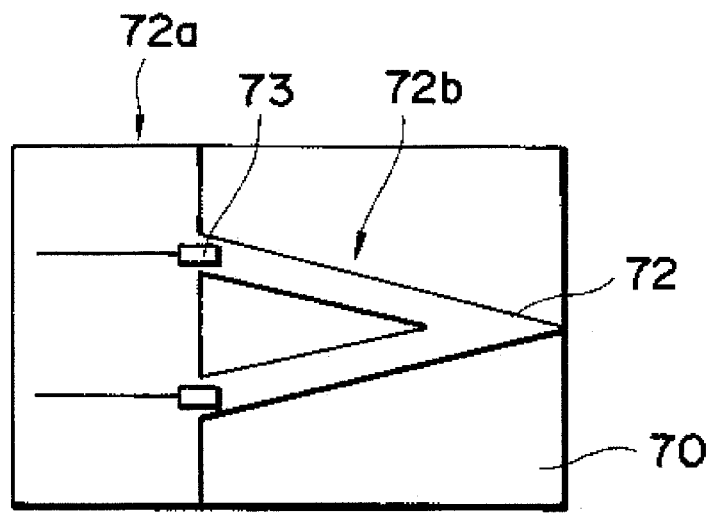
FIG. 26 is a plan view of the cantilever intermediate shown in FIG. 25.
Figure 27:
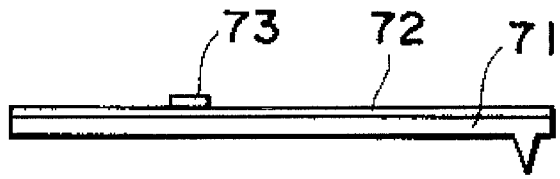
FIG. 27 is a cross sectional view of a cantilever intermediate to illustrate a step for fabricating the cantilever.
Figure 28:
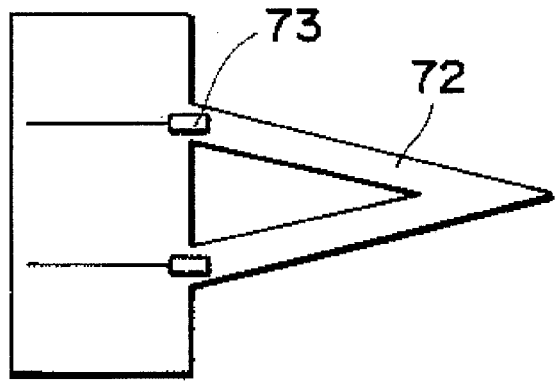
FIG. 28 is a plan view of the cantilever intermediate shown in FIG. 27.
Figure 29:
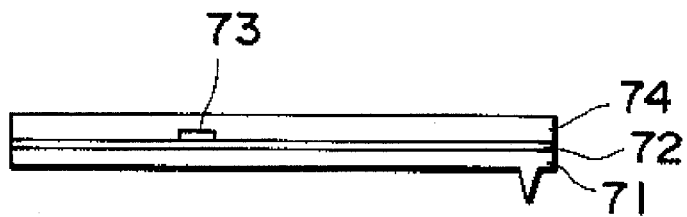
FIG. 29 is a cross sectional view of a cantilever intermediate to illustrate a step for fabricating the cantilever.
Figure 30:
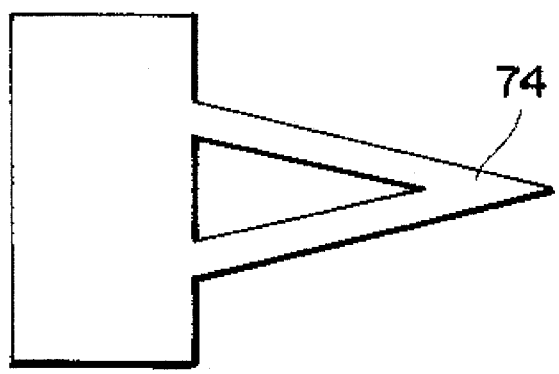
FIG. 30 is a plan view of the cantilever intermediate shown in FIG. 29.
Figure 31:
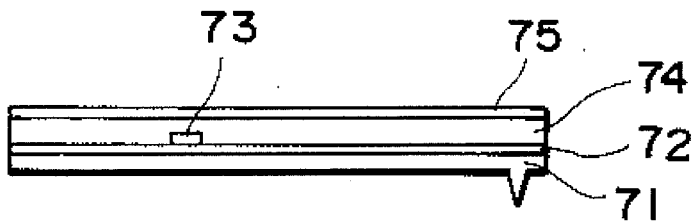
FIG. 31 is a cross sectional view of a cantilever product to illustrate a step for fabricating the cantilever.
Figure 32:
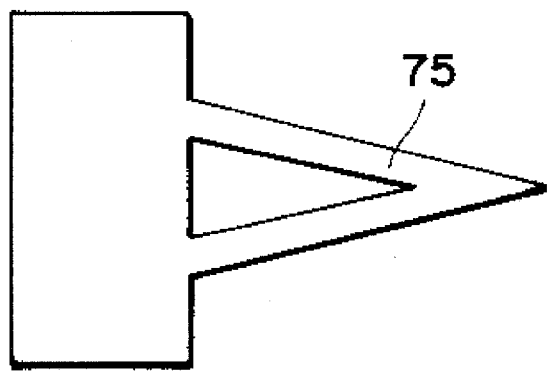
FIG. 32 is a plan view of the cantilever product shown in FIG. 31.

Next described is another embodiment of the cantilever used in atomic force microscopes according to the present invention. A cantilever and a method for producing it are described referring to FIG. 13 thru FIG. 27. FIG. 13 is a side view of a cantilever intermediate and FIG. 14 a plan view of the cantilever intermediate. A silicon nitride layer 71 is first formed on silicon substrate 70 in the thickness of about 0.3 micron by the CVD process. Then, as shown by a side view of a cantilever intermediate in FIG. 15 and a plan view of the cantilever intermediate in FIG. 16, a local area 71a on the silicon nitride layer 71 is removed by the reactive dry etching to form a pore. Further, as shown by a side view of a cantilever intermediate in FIG. 17 and a plan view of the cantilever intermediate in FIG. 18, a stylus (portion to become a needle-shaped tip) is formed by the anisotropic etching using potassium hydroxide. Next, as shown by a side view of a cantilever intermediate in FIG. 19 and a plan view of the cantilever intermediate in FIG. 20, silicon nitride is further deposited over the silicon nitride layer 71 by the CVD process to increase the thickness of silicon nitride layer 71 to 0.5 micron. Then, as shown by a side view of a cantilever intermediate in FIG. 21 and a plan view of the cantilever intermediate in FIG. 22, an aluminum oxide layer 72 is formed in 0.3 micron on the silicon nitride layer 71. Subsequently, as shown by a side view of a cantilever intermediate in FIG. 23 and a plan view of the cantilever intermediate in FIG. 24, a pattern for platinum electrode 73, which is to become a lower electrode, is formed by the ordinary photolithography technology and sputtering method. Further, as shown by a side view of a cantilever intermediate in FIG. 25 and a plan view of the cantilever intermediate in FIG. 26, a photoresist pattern is formed by the photolithography technology, and some silicon nitride layer 71 and aluminum oxide layer 72 are removed by the reactive dry etching in regions except for a cantilever body 72a and a probe portion 72b to become a probe. Next, as shown by a side view of a cantilever intermediate in FIG. 27 and a plan view of the cantilever intermediate in FIG. 28, the silicon substrate 70 is removed by the anisotropic etching with an etchant of ethylenediamine pyrocatechol aqueous solution type. Then, as shown by a side view of a cantilever intermediate in FIG. 29 and a plan view of the cantilever intermediate in FIG. 30, PZT layer 74 is formed in the thickness of 1.0 micron on the aluminum oxide layer 72 by the sputtering technique. A platinum electrode 75 is then formed as an upper electrode on the PZT layer 74, as shown in FIGS. 31 and 32.

Figure 33:
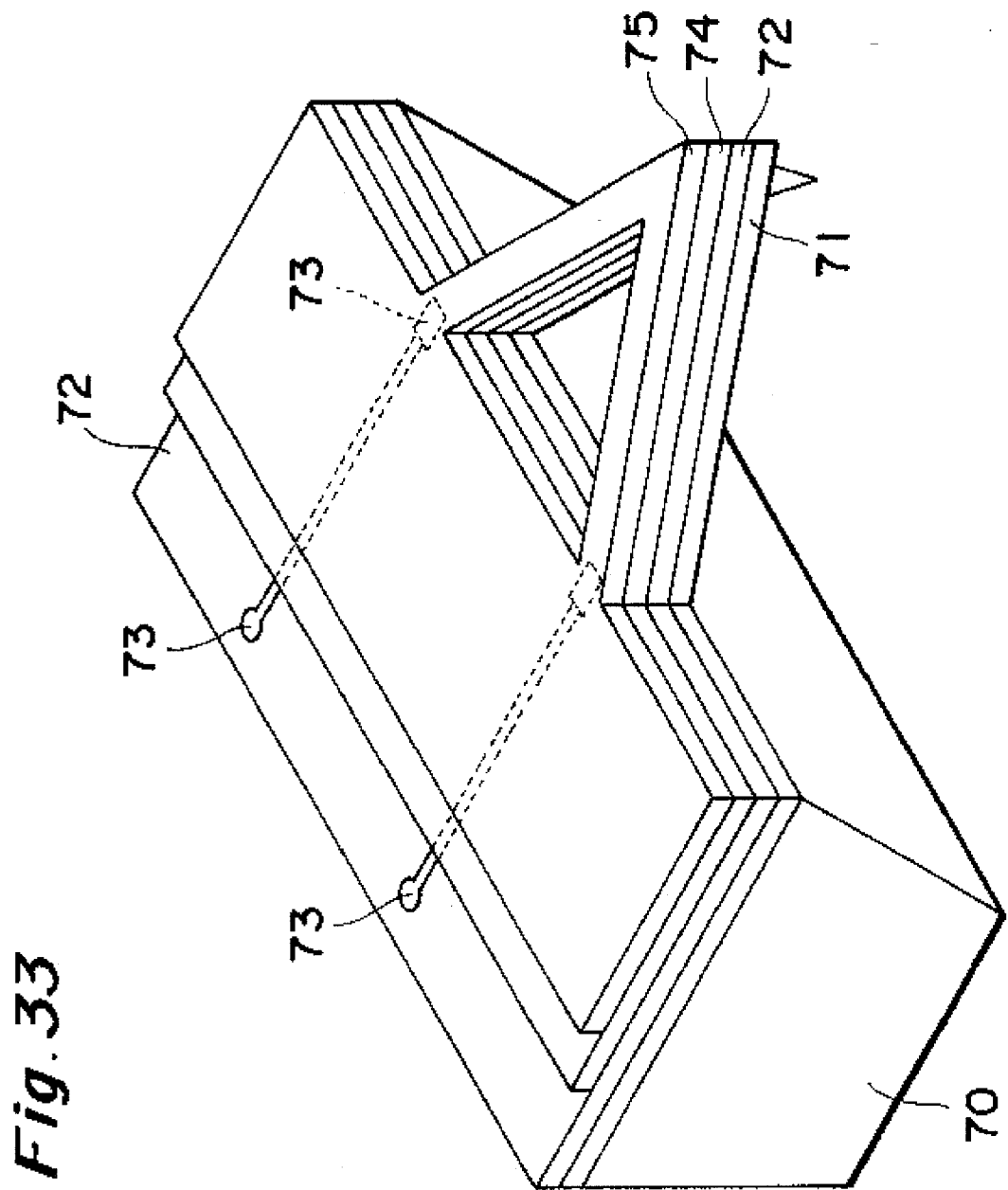
FIG. 33 is a perspective view of the cantilever shown in FIG. 32.

FIG. 33 is a perspective view of the cantilever as produced by the above steps. As shown, the aluminum oxide layer 72 is interposed between the silicon nitride layer 71 and the PZT layer 74 as being a lead-based ferroelectric material, which prevents the silicon nitride layer 71 from reacting with PZT layer 74. The aluminum oxide layer 72 may be replaced with any oxide layer having a very low reactivity with the lead ferroelectric material, for example, a magnesium oxide layer, a magnesium aluminate layer, or a chromium oxide layer. Also, the silicon nitride layer 71 may be replaced or combined with a silicon dioxide layer, a silicate glass, or a metal.

Figure 34:
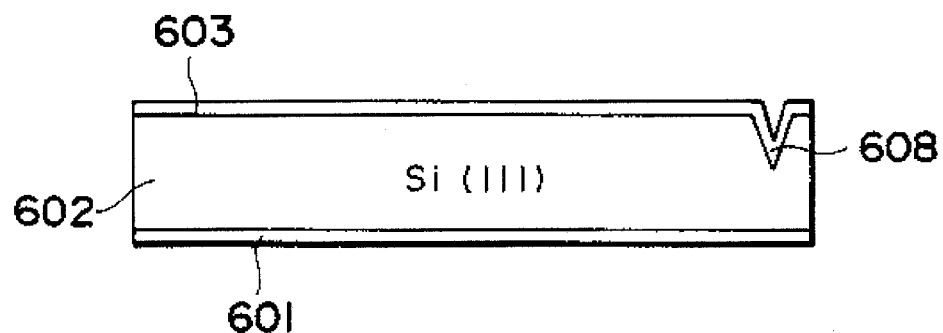
FIG. 34 is a cross sectional view of a cantilever intermediate to illustrate a step for fabricating a cantilever.
Figure 35:
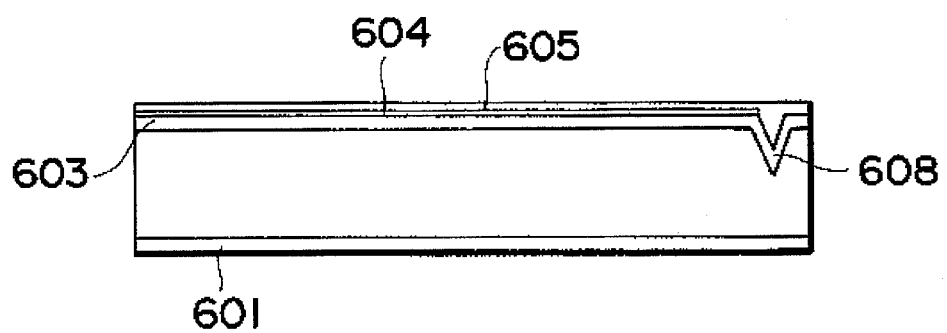
FIG. 35 is a cross sectional view to illustrate a step for fabricating the cantilever.
Figure 36:
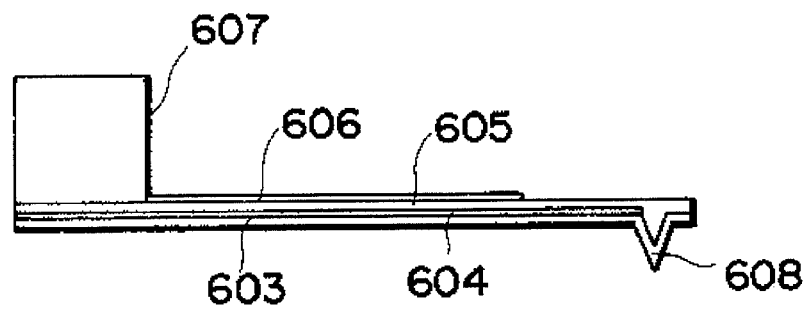
FIG. 36 is a cross sectional view to illustrate a cantilever and a step for fabricating the cantilever.

Next described is another embodiment of the cantilever according to the present invention. FIG. 34 thru FIG. 36 are side views of another cantilever. In this embodiment the cantilever is fabricated using lead titanate zirconate as a piezoelectric crystal. Silicon nitride layers 601, 603 are formed on two surfaces of (111) silicon substrate 602. Then a pit is formed in a predetermined region on the silicon nitride layer 603 by the reactive dry etching and the anisotropic etching with potassium hydroxide. The silicon substrate 602 is oxidized in the pit to form a probe 608 of silicon dioxide. This oxidation is continued before the silicon nitride layer of 200 nm reduces the thickness to 50 nm. A lower platinum electrode 604 is then formed in the thickness of 50 nm on the silicon nitride layer 603 by the photolithography technology. The platinum electrode 604 is <111>-oriented according to the plane direction of silicon substrate 602. PZT layer 605 is further formed by the sputtering, while the PZT layer 605 is also <111>-oriented according to the plane direction of platinum electrode 604. The crystal system of PZT layer 605 forming a thin film includes only the rhombohedral system. Then a platinum electrode 606 to become an upper electrode is formed on PZT layer 605 by the vapor deposition method. The silicon nitride layer 601 on the back surface of silicon substrate 602 is removed by the reactive dry etching and the silicon substrate 602 is also removed by the anisotropic etching with potassium hydroxide. Finally, a glass block 607 for fixing the cantilever is electrostatically adhered onto PZT layer 605.

The size of the cantilever is about 100 microns in length, about 20 microns in width, and about 2 microns in thickness. The size of PZT layer 605 as a piezoelectric thin film is 100 microns in length, 20 microns in width, and 1 micron in thickness.

To evaluate the life of this cantilever, the PZT layer 605 was operated as an actuator. An ac voltage of 10 kHz and 10 V was applied between platinum electrodes 604 and 606. A displacement of 1 micron of lever tip 608 was observed using an optical lever. This displacement amount is a relatively large strain for ferroelectric materials. This cantilever was kept in the displacement amount while the ac voltage was applied for a long time between platinum electrodes 604 and 606. The cantilever using the oriented PZT showed no change in displacement amount of lever tip 608 after application of the voltage for ten hours. As a comparative example, a cantilever was produced only of silicon oxide, and a non-oriented PZT layer was formed thereon in the same shape as that in FIG. 36. Then the same life evaluation test was conducted after a polarization treatment of the PZT layer. After ten hours, a displacement amount of lever tip decreased to about one third of an initial displacement. This must be because the effect of polarization treatment was lost.

Figure 37:
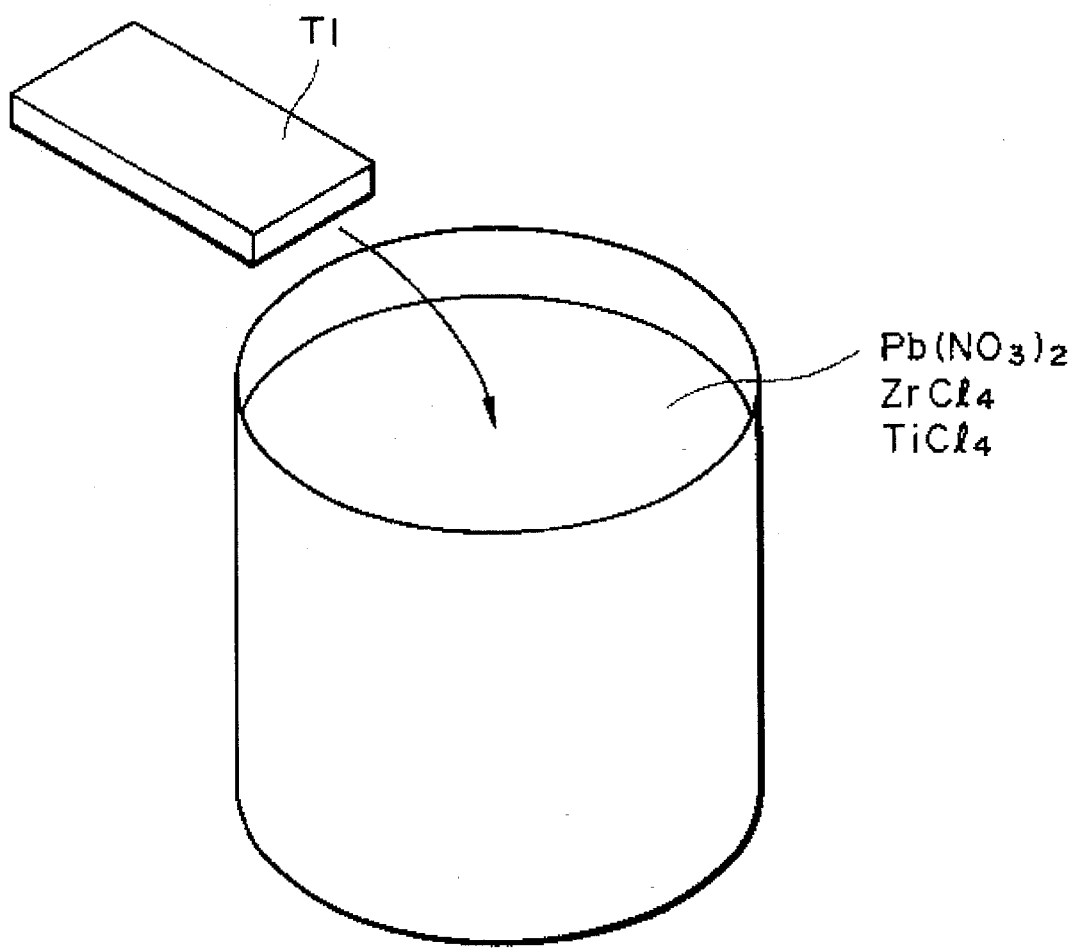
FIG. 37 is an explanatory drawing to illustrate the hydrothermal synthesis reaction with titanium foil.

The cantilever can be fabricated by using another method. As shown in FIG. 37, a titanium foil T1 of length 1.5 mm, width 100 µm, and thickness 10 µm is immersed in a solution mixture of Pb(NO$_3$)$_2$, ZrCl$_4$, and TiCl$_4$ as adjusted in the composition of phase boundary and a 5N KOH aqueous solution is added to the mixture, effecting a hydrothermal synthesis reaction at 120° C. and for 200 hours. As a result, PZT layers are produced in about 10 µm on the both sides of the titanium foil T1. PZT takes the cubic system, which is principally <001>-oriented under the film-forming conditions. Platinum electrodes are formed on the both PZT layers by the vapor deposition method and the resultant is fixed at about one third of the foil length in the form of a cantilever while giving wiring.

It was operated as an actuator and evaluated in respect of reliability, in the same manner as the cantilever shown in FIG. 36. Since it was found from performance characteristics at low frequency that the polarization direction was directed toward the titanium electrode, an ac voltage of 10 V and 1 kHz was applied between the two external electrodes, observing the amplitude of about 10 µm by an optical lever. There was no change of the amplitude observed even after the continuous operation of 50 hours.

Another embodiment of the cantilever is next described.

Figure 38:
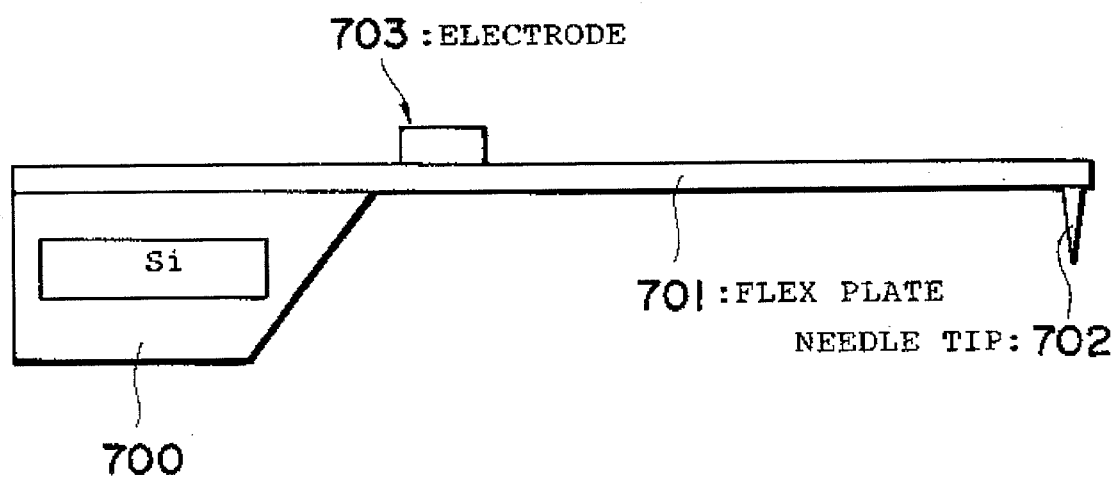
FIG. 38 is a cross sectional view of a cantilever in an embodiment.

A flexible plate PL is made of silicon dioxide 700 with an intermediate layer of a thin-film displacement sensor of lead titanate zirconate in the arrangement shown in FIG. 38 by the following production method.

The cantilever of silicon dioxide 701 was produced by the conventional method using the micromachining and anisotropic etching of Si.

Production of thin-film displacement sensor

Figure 39:
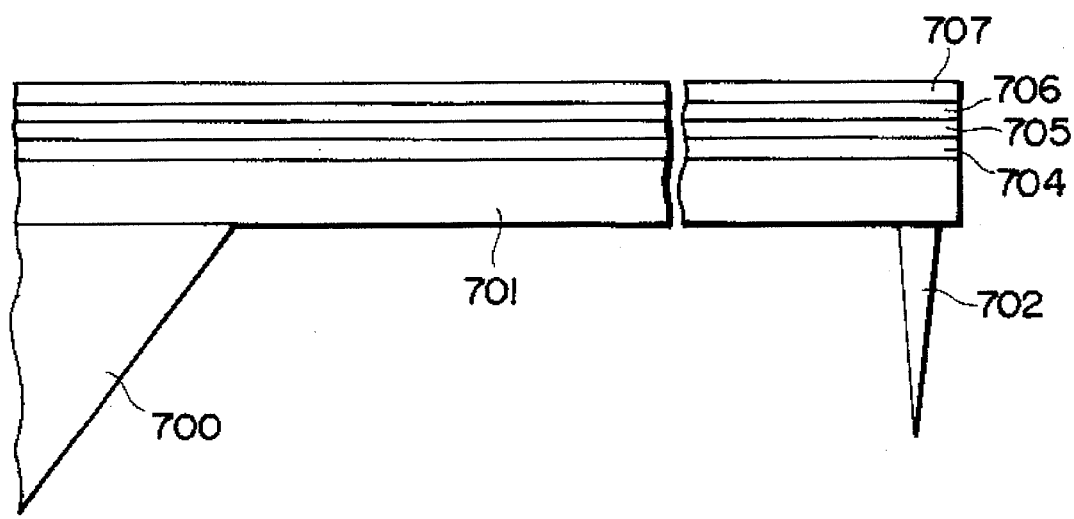
FIG. 39 is a cross sectional view of the cantilever to illustrate a step for fabricating the cantilever shown in FIG. 38.

A tantalum buffer layer 704 is first formed on the above cantilever provided with the plate of SiO$_2$, as shown in FIG. 39. The tantalum buffer layer 704 is formed in about 50 Å by the sputtering technique with a target of tantalum metal at ordinary temperature under the pressure of 2×10$^{-3}$ Torr of Ar-oxygen mixture gas (9:1) in a vacuum chamber. Under the same conditions a platinum electrode layer 705 is further formed in about 500 Å with a target of platinum. Then, an intermediate piezo-electric layer 706 is formed in 1 µm on the platinum electrode 705 by the sputtering method with a target of a sintered body of lead titanate zirconate under the pressure of below 10$^{-4}$ Torr of oxygen gas in vacuum chamber. Finally, a gold thin film 707 to become an upper electrode is formed by the vapor deposition method under the oxygen gas pressure of below 10$^{-5}$ Torr.

Figure 40:
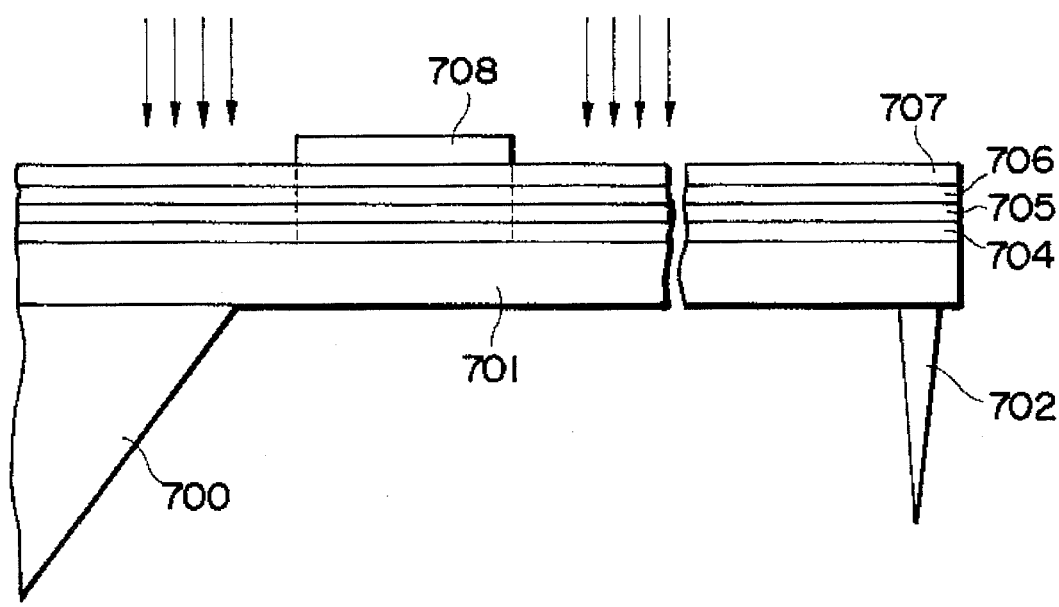
FIG. 40 is a cross sectional view of the cantilever to illustrate a step for fabricating the cantilever shown in FIG. 38.

After that, a photoresist layer 708 is formed over the gold thin film 707 and the photoresist layer 708 is removed excluding the sensor-forming portion by exposure and development by an exposure apparatus. Subsequently, etching with argon gas is carried out under the conditions of acceleration voltage 500 V, incident angle 0°, and ion current density 1 mA/cm$^2$, removing the upper and lower electrodes and the intermediate piezoelectric layer. (See FIG. 40.) Finally, the remaining resist layer is removed to obtain a cantilever equipped with a thin-film displacement sensor as shown in FIG. 38. Lead wires are made of a metal, for example, aluminum by ordinary process, though not shown in FIG. 38.

The size of the cantilever is 100 µm in length ($l_1$), 20 µm in width ($w_1$), and 2 µm in thickness ($t_1$). The size of the piezoelectric thin film is 10 µm in length ($l_2$), 20 µm in width ($w_2$), and 1 µm in thickness ($t_2$). Letting d be a displacement of probe tip (1 nm), the stress ($\sigma$) occurring in the ferroelectric thin film 706 is approximately as follows:

$$\sigma = -\frac{d \cdot 3E \cdot \frac{t_1}{2}}{l_1^2}.$$

For the stress, polarization charges as defined by the following formula are produced in the ferroelectric film 706.

$$D = d_{31} \cdot \sigma$$

In the formulas, E is the Young's modulus of silicon dioxide film-formed on silicon, and $d_{31}$ a piezoelectric constant of lead titanate zirconate in the horizontal vibration direction as represented by 31. The polarization charges change depending upon the material constants of E and $d_{31}$, but a potential difference of about 1 mV is produced between the two electrodes for ferroelectric thin film 706. A displacement amount of the cantilever can be obtained by effecting the ordinary signal processing used for sonar or the like for acoustic diagnosis, on the induced voltage.

As shown in FIG. 38, the thin-film displacement sensor of the present invention has the very simple structure, in which the sensor portion itself needs not constitute the cantilever or a part of the cantilever. Therefore, the displacement sensor can be used as a displacement sensor mounted not only on the flexible plate of silicon oxide thin film as shown in the present embodiment, but also on a flexible plate made of another material selected from various materials.

Figure 41:
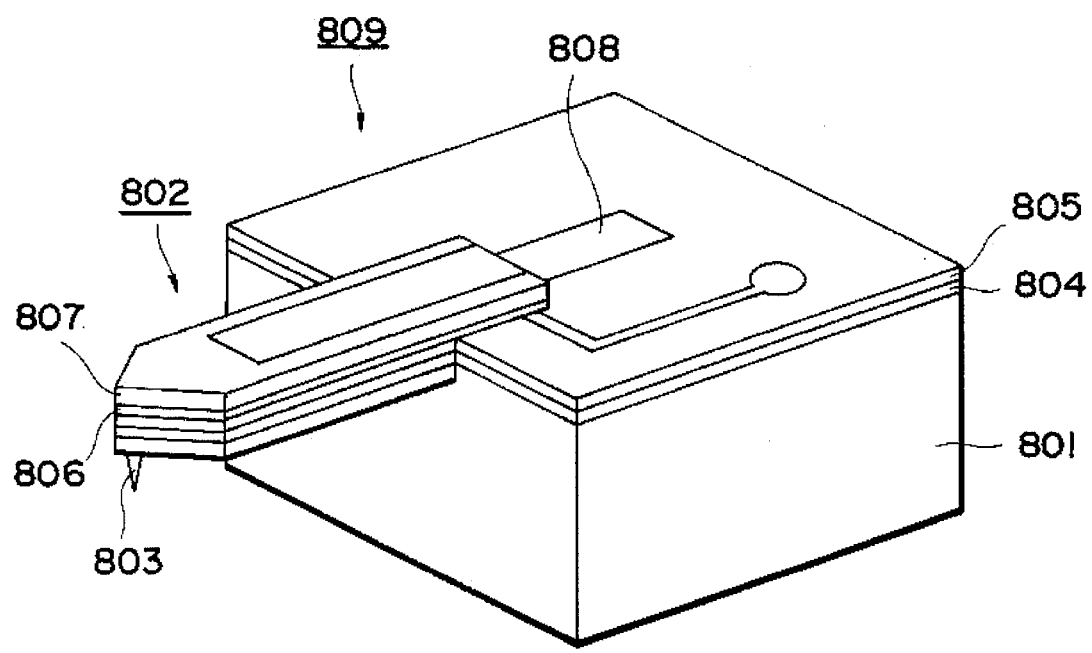
FIG. 41 is a perspective view of a cantilever.

Next, FIG. 41 shows the basic structure of an AFM cantilever with a probe, in which a piezoelectric thin film for drive is formed, based on the present invention. The production method is pursuant to the method as disclosed in Japanese Patent Application No. 5-180532. In detail, a silicon nitride layer 804 is formed on a silicon substrate 801 by the CVD method, and the silicon nitride layer 804 is removed in a portion corresponding to a probe 803 by the reactive dry etching. An etched pit to become a probe is formed by the anisotropic etching with potassium hydroxide on the silicon substrate 801. Silicon nitride is further deposited on the silicon nitride layer 804 by the CVD method. Subsequently, a magnesium oxide layer 805 to become a buffer layer is formed on the silicon nitride layer 804 by the sputtering method. Then a pattern of lower platinum electrode 806 is formed on MgO film 805 by the ordinary photolithography and sputtering methods. Further, a photoresist pattern is formed by the photolithography, and the magnesium oxide 805 and silicon nitride layer 804 are removed except for portions to become cantilever body 802 and cantilever base 809 by the reactive dry etching. Then the cantilever body 802 is formed by the anisotropic etching. After that, PZT layer 807 is formed on the lower platinum electrode 806 by the sputtering method. An upper platinum electrode 808 is finally produced by mask vapor deposition. It is to be desired that the polarization treatment is effected on the PZT layer 807, using the upper and lower electrodes 808 in order to effectively draw out the piezoelectric effect.

Applying the conventional silicon processes as described, the AFM cantilever of the present invention can be attained with a sharp probe and an appropriate spring constant equivalent to those of the conventional cantilevers. Also, since the structure of PZT layer 807 and electrodes 806, 808 is simple, a load on the processes is almost equal to that for the conventional cantilevers. Also, mounting the piezoelectric film 807 on the cantilever, the cantilever itself can be independently driven, whereby it can have basically the same function as the quartz oscillator probe.

Figure 42:
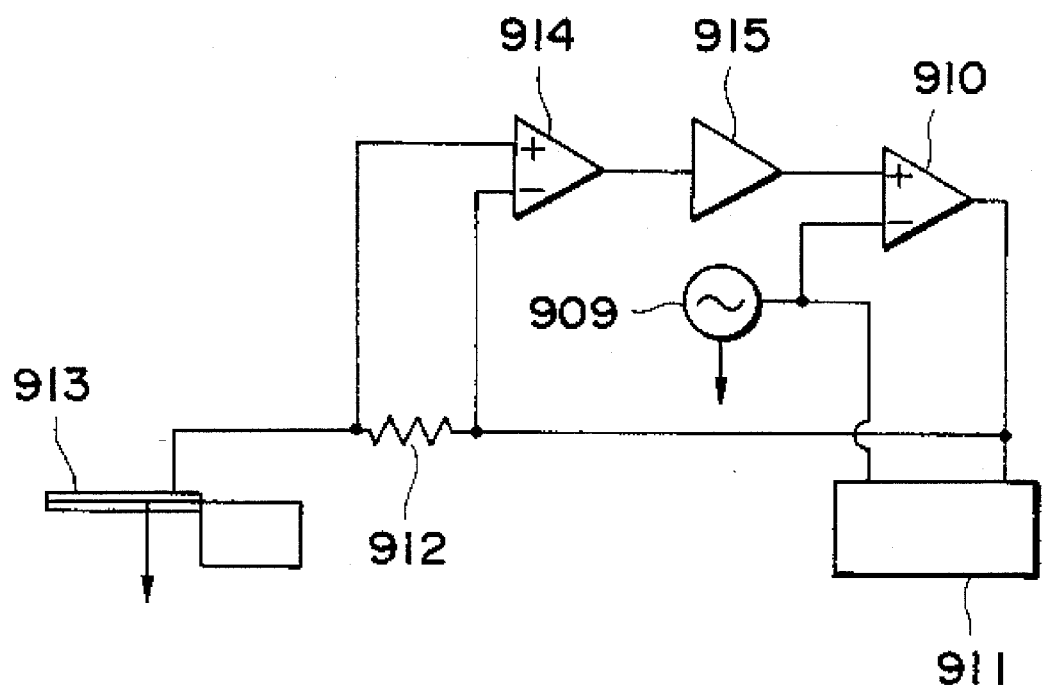
FIG. 42 is a drawing to show a cantilever and a circuit for vibrating the cantilever and processing a signal from the cantilever.
Figure 43:
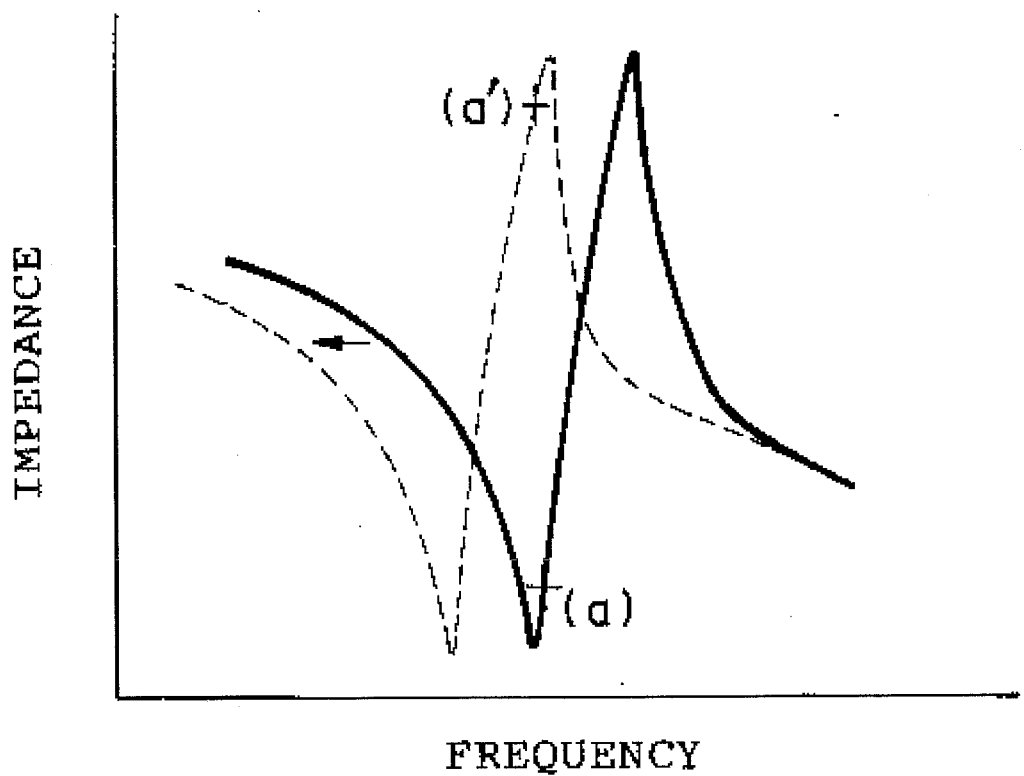
FIG. 43 is a graph to show resonance characteristics of impedance of a piezoelectric thin film.

FIG. 42 shows an embodiment of a surface configuration measuring apparatus using the AFM cantilever with a piezoelectric thin film based on the present invention, in which the piezoelectric thin film is included in a feedback circuit. An oscillator 909 supplies an ac drive signal near the resonance frequency of AFM cantilever 913 to a piezoelectric thin film 807 on the cantilever. The impedance of piezoelectric thin film 807 largely changes near the resonance frequency, as shown in FIG. 43. For example, suppose the cantilever is driven at the frequency indicated by (a) in FIG. 43. An electric current flowing in piezoelectric thin film 807 is measured as follows. A high-resistance differential amplifier 914 detects it as a voltage through a detection resistor 912. A phase compensating circuit 915 matches the phase of the signal with the drive signal, and a gain-variable amplifier 910 adjusts the gain. A lock-in-amplifier 911 performs phase detection so as to measure the current. The detection sensitivity can be further improved by setting the Q value of the total system composed of the AFM cantilever and the electric circuit to a value higher than the Q value of the cantilever alone, while adjusting the amplification rate and the phase of the positive feedback circuit.

If a force acts between the probe of the resonating AFM cantilever and a detected object, the resonance frequency is shifted to the lower frequency range, as shown by the arrow in FIG. 43. On this occasion, the impedance of piezoelectric thin film 807 changes from (a) to (a') in the drawing, so that a change of the interatomic force, i.e., the configuration of the surface of detected object, can be known by detecting an amount of the change through the lock-in-amplifier 911. Further, similarly as the feedback mode of conventional AFM, it is possible that while keeping the attraction scanning state by feedback control to an AFM scanning system so as to maintain the impedance constant, the configuration of sample surface can be measured with very little damage on the detected object.

Figure 44:
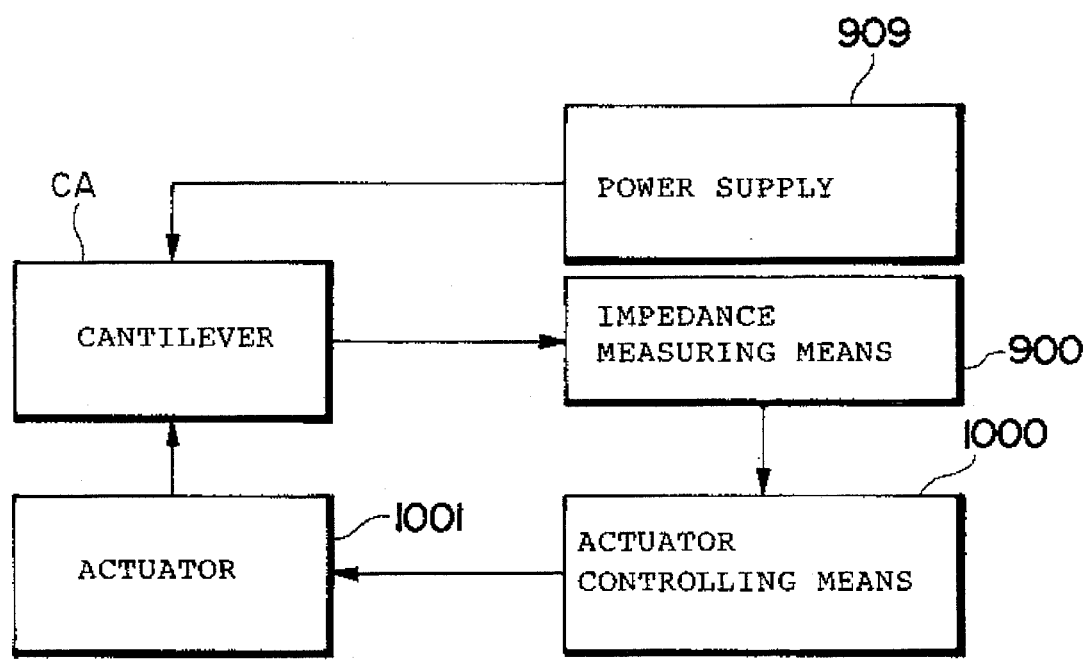
FIG. 44 is a block diagram of a atomic force microscope according to present embodiment.
Figure 45:
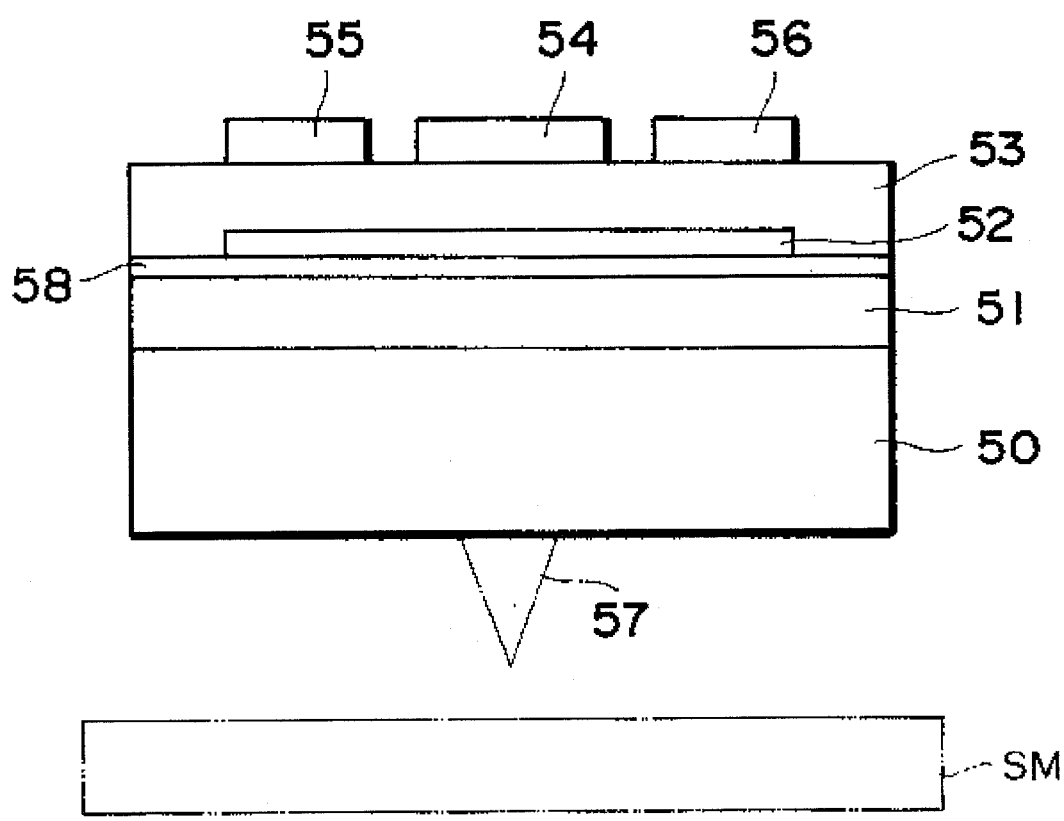
FIG. 45 is a cross sectional view of a cantilever drawn by the same method of expression as FIG. 6.

FIG. 44 is a block diagram of the atomic force microscopy shown in FIG.41 and FIG. 42. As shown in FIG. 45 the AFM comprises impedance measuring means 900 for measuring an impedance of the first layer 807, power supply 909, actuator controlling means 1000, and actuator 1001. The self vibrator constructed of the electrodes 808, 806 and first piezoelectric layer 807 shares the first layer 807, the first electrode 808 and the second electrode 806 with the self strain detector. The power supply 909 applies an ac voltage between the first electrode 808 and the second electrode 806. The frequency of the ac voltage is close to a resonance frequency of the cantilever CA to such an extent that the impedance of the first layer 807 changes when the cantilever CA shown in FIG. 41 receives a atomic force.

The impedance measuring means 900 is connected between the first electrode 808 and the second electrode 806 to detect the impedance between the first electrode 808 and the second electrode 806.

The actuator 1001 is electrically connected to the impedance measuring means 900, for moving the measured sample in a direction in which the cantilever CA is displaced with application of the ac voltage. The actuator controlling means 1000 controls the actuator 1001 so that the impedance measured by the impedance measuring means 900 is kept constant, so as to move the measured sample. In this case, the first layer CA constitutes a part of a feedback circuit.

Figure 46:
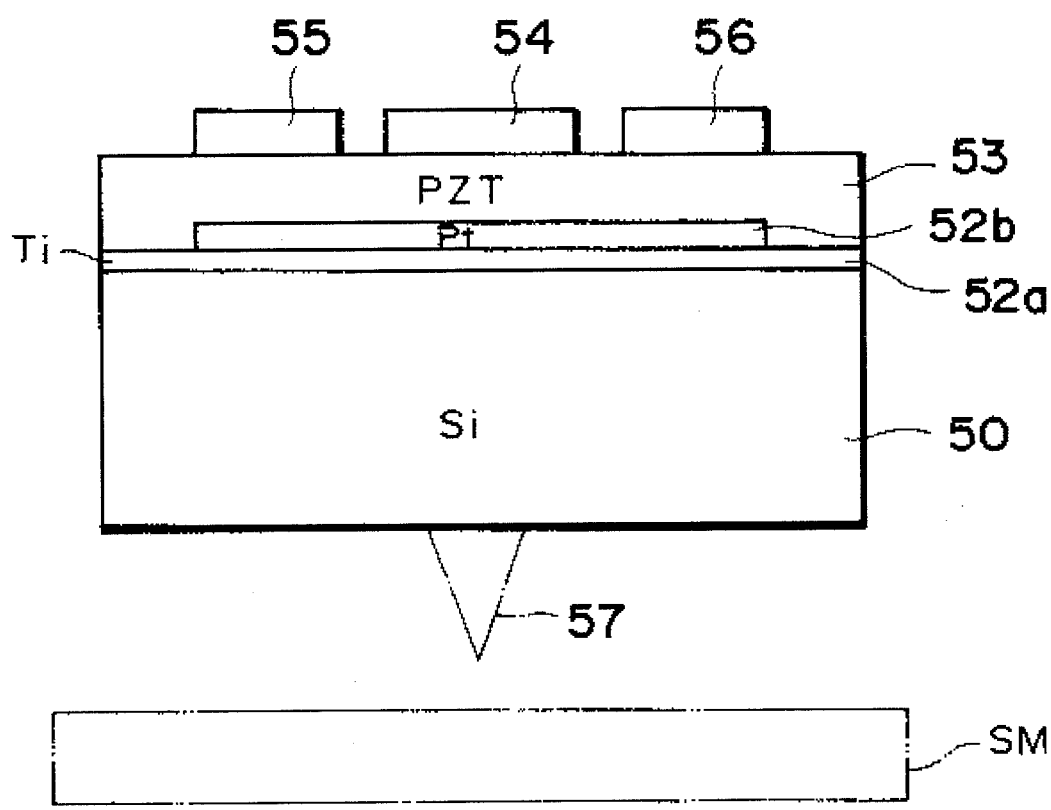
FIG. 46 is a cross sectional view of a cantilever drawn by the same method of expression as FIG. 6.

From the invention thus described, it will be obvious that the invention may be varied in many ways. FIG. 45 is a cross sectional view of a cantilever drawn by the same method of expression as FIG. 6. Silicon nitride layer 51 is formed on a silicon substrate or layer 50, and MgO insulator layer 58 is formed on the silicon nitride layer 51. platinum first electrode 52 is formed on the insulator layer 58, piezoelectric layer (PZT layer) 53 is formed on the first electrode 52, and three electrodes 54, 55, 56 are arranged on the piezoelectric layer 53, as shown in FIG. 45. The pointed portion probe of silicon dioxide 57 is formed on the silicon substrate 50. In this embodiment shown in FIG. 45, the insulator layer 58 serves as the buffer layer. When the platinum electrode 52 is deposited on the silicon substrate 50, an adhesion between the electrode 52 and silicon substrate 50 is not sufficient. FIG. 46 is a cross sectional view of a cantilever drawn by the same method of expression as FIG. 6, and the cantilever improves the adhesion between electrode 52a and silicon substrate 50. As shown in this figure, electrode 52a, 52b is formed on the silicon substrate 50, and piezoelectric layer (PZT layer containing lead) 53 is disposed between the electrode 52a, 52b and electrodes 54, 55, 56. The pointed potion 57 is formed on the silicon substrate 50. The electrode 52a, 52b comprises a titanium layer 52a and platinum layer 52b.

The titanium layer 52a functions as barrier metal for restricting the diffusion of silicon atoms from the silicon layer or substrate 50 into the first layer 53. The adhesion between the titanium layer 52a and the silicon layer 50 is higher than that between the silicon layer 50 and the platinum layer 52b. If the titanium layer 52a is interposed between the platinum layer 52b and the silicon substrate 50, the platinum layer 52b and the silicon substrate 50 become resistant to peeling-off. Further, the thickness of the platinum layer 52a is preferably not less than 20 nanometers for growth of the first piezoelectric layer (PZT layer) 53. The thickness of the platinum layer 52a is preferably not less than 200 nanometers for stress relaxation between the first layer 53 and the silicon substrate 50.

Figure 47:
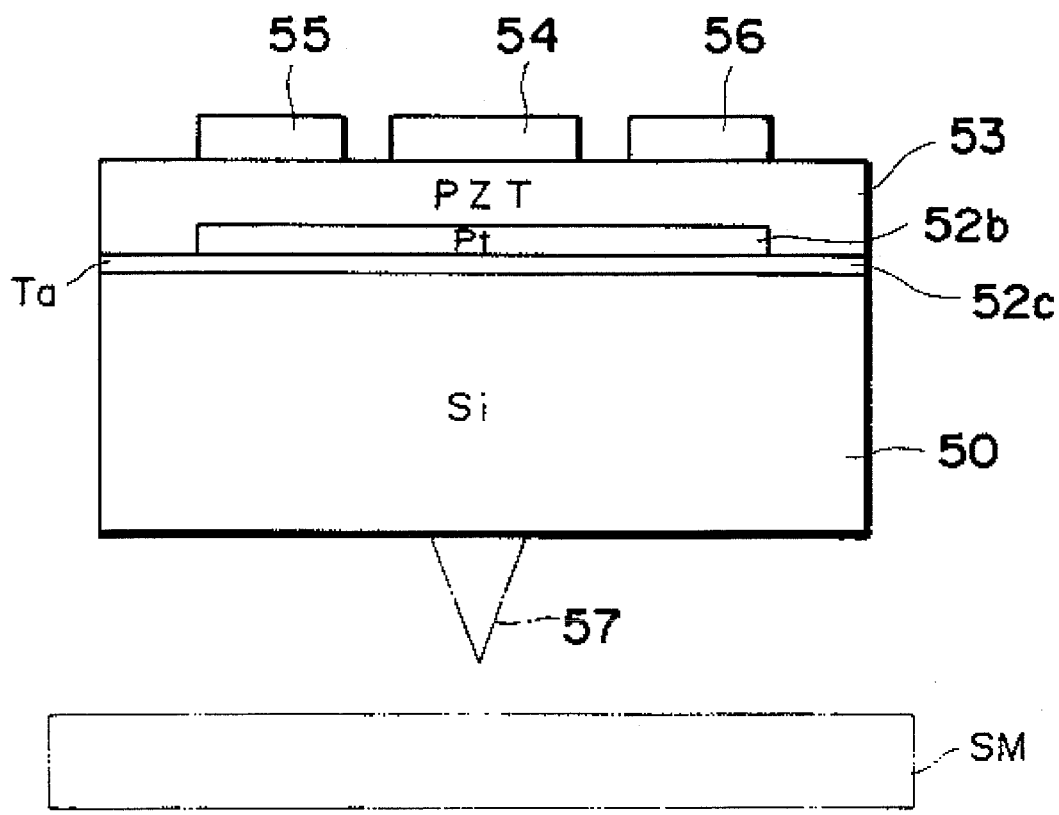
FIG. 47 is a cross sectional view of a cantilever drawn by the same method of expression as FIG. 6.

Also, the electrode may comprise a platinum layer and a tantalum layer. FIG. 47 is a cross sectional view of a cantilever drawn by the same method of expression as FIG. 46. As shown in this figure, electrode 52c, 52b is formed on the silicon substrate 50, and piezoelectric layer (PZT layer) 53 is disposed between the electrode 52c, 52b and electrodes 54, 55, 56. The pointed potion 57 is formed on the silicon substrate 50. The electrode 52c, 52b comprises a tantalum layer 52c and platinum layer 52b. The tantalum layer 52c is formed on the platinum layer 52b so that the platinum layer 52b is disposed between the first piezoelectric layer 53 and the tantalum layer 52c. The tantalum layer has the same function as the titanium layer, i.e., the adhesion between the tantalum layer 52c and silicon layer is improved. Since the tantalum layer 52c is unlikely to form silicide, the use of tantalum layer 52c is effective. The thickness of the tantalum layer 52c or the titanium layer 52b shown in FIG. 46 is preferably not less than 10 nanometers taking the adhesion into account. Taking the diffusion of silicon into consideration, the thickness is preferably not less than 100 nanometers.

Figure 48:
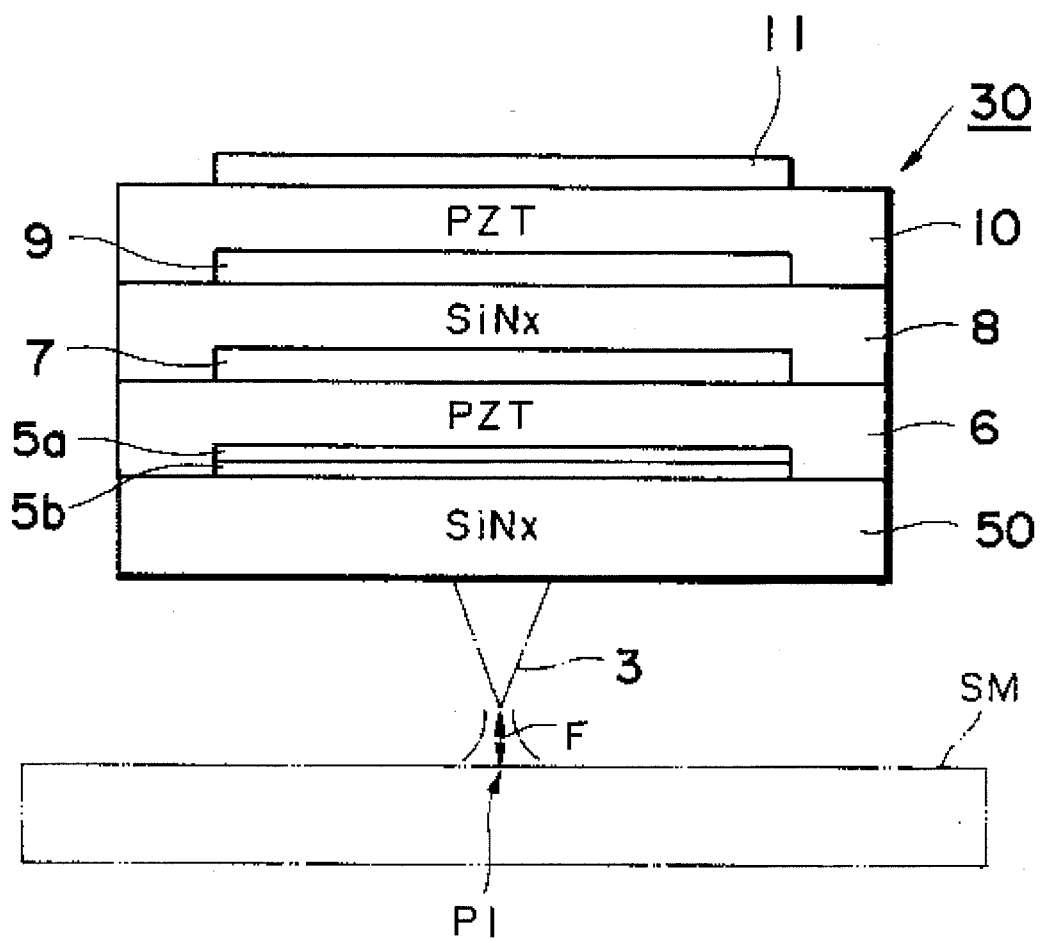
FIG. 48 is a cross sectional view of a cantilever drawn by the same method of expression as FIG. 6.

Further, the titanium or tantalum layer is also adapted to the cantilever shown in FIG. 6. FIG. 48 is a cross sectional view of a cantilever drawn by the same method of expression as FIG. 6. As shown in FIG. 48, the electrode 5a, 5b comprises a platinum layer 5a and titanium or tantalum layer 5b. The electrode 5a, 5b is formed on a silicon substrate 50, and the piezoelectric layer (PZT layer) 6, electrode 7, silicon nitride layer 8, electrode 9, piezoelectric layer 10 and electrode 11 is formed as shown in the figure. The titanium or tantalum layer 5b is in contact with the silicon substrate 50 and improves the adhesion and characteristics of the cantilever.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Applications No. 175368 filed on Jul. 15, 1993, No. 180532 filed on Jul. 22, 1993, No. 180534 filed on Jul. 22, 1993, No. 40227 filed on Mar. 11, 1994, and No. 180786 filed on Jul. 8, 1992 are hereby incorporated by reference.

What is claimed is:

1. A scanning probe microscope for evaluating a surface of a sample comprising a cantilever for interaction with said surface, said cantilever having a self vibrator for vibrating said cantilever and a self strain detector for detecting a displacement of said cantilever wherein said self vibrator comprises a first layer of piezoelectric crystal, a first electrode and a second electrode formed on said first layer so that said first layer is located between said first electrode and said second electrode.

2. A scanning probe microscope according to claim 1, wherein said cantilever has a first portion and a second portion, said cantilever is fixed at said first portion, and said self vibrator is provided at least in said second portion.

3. A scanning probe microscope according to claim 1, wherein said self strain detector is formed on said self vibrator, said self strain detector comprising:

a second layer of a piezoelectric crystal;

a third electrode formed on said second layer; and a fourth electrode formed on said second layer so that said second layer is located between said third electrode and said fourth electrode.

4. A scanning probe microscope according to claim 3, wherein said plate further comprises a first insulator layer disposed between said self vibrator and said self strain detector.

5. A scanning probe microscope according to claim 1, said scanning probe microscope further comprising:

a sample table; and an actuator for moving said cantilever relative to said sample table.

6. A scanning probe microscope according to claim 3, said scanning probe microscope further comprising a power supply for applying an ac voltage between said first electrode and said second electrode of said vibrator to vibrate said cantilever in the direction of said first electrode to said second electrode.

7. A scanning probe microscope according to claim 6, said scanning probe microscope further comprising a signal processing unit for processing a signal extracted from said third electrode and said fourth electrode, said signal concerning an amount of the strain of said cantilever.

8. A scanning probe microscope according to claim 3, wherein said cantilever further comprises a second insulator layer formed on said self strain detector so that said self strain detector is disposed between said self vibrator and said second insulator layer.

9. A scanning probe microscope according to claim 3, wherein said cantilever further comprises a second insulator layer formed on said self vibrator so that said self vibrator is disposed between said self strain detector and said second insulator layer.

10. A scanning probe microscope according to claim 3, wherein said first layer or said second layer is made of a material comprising either one of lead titanate zirconate-lanthanum oxide, lead magnesium niobate-lead titanate, and barium titanate.

11. A scanning probe microscope according to claim 8, wherein said cantilever has a first portion and second portion, said cantilever is fixed at said first portion, said cantilever has a pointed portion made of a material containing silicon dioxide, said pointed portion is formed on said second insulator layer made of a material containing silicon nitride, and said pointed portion is arranged on said second portion.

12. A scanning probe microscope according to claim 9, wherein said cantilever has a first portion and second portion, said cantilever is fixed at said first portion said cantilever has a pointed portion made of a material containing silicon dioxide, said pointed portion is formed on said second insulator layer made of a material containing silicon nitride, and said pointed portion is arranged on said second portion.

13. A scanning probe microscope according to claim 4, wherein said cantilever further comprises a first buffer layer disposed between said first insulator layer and said second layer, wherein said second layer is made of a material containing lead.

14. A scanning probe microscope according to claim 13, wherein said first insulator layer is silicon nitride.

15. A scanning probe microscope according to claim 13, wherein said first buffer layer is made of a material containing either one of aluminum oxide, magnesium oxide, and chromium oxide.

16. A scanning probe microscope according to claim 13, wherein said cantilever further comprises a second buffer layer disposed between said first layer and said first insulator layer, wherein said first layer is made of a material containing lead.

17. A scanning probe microscope according to claim 16, wherein said first insulator layer is silicon nitride.

18. A scanning probe microscope according to claim 17, wherein said second buffer layer is made of a material containing either one of aluminum oxide, magnesium oxide, and chromium oxide.

19. A scanning probe microscope according to claim 4, wherein said first electrode is made of a material containing platinum.

20. A scanning probe microscope according to claim 8, wherein said cantilever further comprises a silicon layer formed on said self strain detector so that said self strain detector is disposed between said self vibrator and said second insulator layer, said fourth electrode is disposed between said second layer and silicon layer, and said fourth electrode is made of the material containing platinum.

21. A scanning probe microscope according to claim 20, wherein fourth electrode is made of the material further containing titanium.

22. A scanning probe microscope according to claim 20, wherein fourth electrode is made of the material further containing tantalum.

23. A scanning probe microscope according to claim 1, wherein said cantilever further comprises an insulator layer formed on said first electrode so that said first electrode is disposed between said first layer and said insulator layer.

24. A scanning probe microscope according to claim 23, said scanning probe microscope further comprising:
   a third electrode formed on said first layer;
   a power supply for applying an ac voltage between said first electrode and said second electrode; and
   a signal processing unit for processing a signal concerning an amount of the strain of said cantilever and extracted from said second electrode and said third electrode.

25. A scanning probe microscope according to claim 23, wherein said cantilever further comprises a silicon layer so that said first electrode is disposed between said first layer and said silicon layer, and said first electrode comprises:
   first metal layer made of a material containing titanium being in contact with said silicon layer; and
   a second metal layer made of a material containing platinum formed on said first metal layer.

26. A scanning probe microscope according to claim 23, wherein said cantilever further comprises a silicon layer so that said first electrode is disposed between said first layer and said silicon layer, and said first electrode comprises:
   first metal layer made of a material containing tantalum being in contact with said silicon layer; and
   a second metal layer made of a material containing platinum formed on said first metal layer.

27. A scanning probe microscope according to claim 1, wherein said plate comprises a fourth electrode formed on said first layer so that said first layer is disposed between said first electrode and said fourth electrode and that said second electrode is disposed between said third electrode and said fourth electrode.

28. A scanning probe microscope according to claim 27, wherein said second electrode, said third electrode, and said fourth electrode are formed on a same plane but said second electrode, said first electrode, and said third electrode are not formed on a same plane.

29. A scanning probe microscope according to claim 23, wherein said first layer is made of a material containing either one of lead titanate zirconate-lanthanum oxide, lead magnesium niobate-lead titanate, and barium titanate; said insulator layer is silicon nitride; and said insulator is fixed to a pointed portion made of a material containing silicon dioxide.

30. A scanning probe microscope according to claim 23, said first layer is made of a material containing lead and said cantilever further comprises a first buffer layer disposed between said insulator layer and said first layer.

31. A scanning probe microscope according to claim 1, said scanning probe microscope further comprising impedance measuring means for measuring an impedance of said first layer, wherein said self vibrator shares said first layer, said first electrode, and said second electrode with said self strain detector.

32. A scanning probe microscope according to claim 31, said scanning probe microscope further comprising a power supply for applying an ac voltage between said first electrode and said second electrode, wherein a frequency of said ac voltage is close to a resonance frequency of said cantilever to such an extent that the impedance of said first layer changes when said cantilever receives a force, wherein said impedance measuring means comprises a signal processing unit connected to said first electrode and second electrode for processing a signal extracted from said first electrode and said second electrode, said signal concerning an amount of the strain of said cantilever.

33. A scanning probe microscope according to claim 32, further comprising:
   an actuator electrically connected to said impedance measuring means, for moving said measured sample in a direction in which said cantilever is displaced with application of said ac voltage; and an actuator controlling means for controlling said actuator so that an impedance measured by said impedance measuring means is kept constant, so as to move said measured sample.

34. A scanning probe microscope according to claim 33, wherein said first layer constitutes a part of a feedback circuit.

35. A cantilever having a first end portion having a pointed portion and second end portion, said cantilever comprising a plate which can be deflected in a direction of the thickness thereof and which is located between said first end portion and said second end portion, said plate comprising, for vibrating said plate by itself in the direction of the thickness:
   first layer made of a piezoelectric crystal;
   first electrode formed on said first layer wherein said first electrode comprises two separate material layers; and
   second electrode formed on said first layer so that said first layer is disposed between said first electrode and said second electrode.

36. A cantilever according to claim 35, wherein said plate comprises:
   a third electrode formed above said second electrode;
   a second layer located on said third electrode so that said third electrode is disposed between said second layer and said second electrode; and a fourth electrode formed on said second layer so that said second layer is disposed between said third electrode and said fourth electrode.

37. A cantilever according to claim 36, said cantilever further comprising:
   a first insulator layer formed on said first electrode so that said first electrode is disposed between said first layer and said first insulator layer; and
   a first buffer layer disposed between said first insulator layer and said first layer,
wherein said first layer is made of a material containing lead.

38. A cantilever according to claim 37, wherein said first insulator layer is silicon nitride.

39. A cantilever according to claim 37, wherein said first buffer layer is made of a material containing either one of aluminum oxide, magnesium oxide, and chromium oxide.

40. A cantilever according to claim 41, wherein one material layer of said first electrode is made of a material containing platinum.

41. A cantilever according to claim 35, further comprising a silicon layer located on said first electrode so that said first electrode is disposed between said first layer and said silicon layer; wherein said first electrode comprises:
   a platinum layer formed on said first layer; and
   a titanium layer located on said platinum layer so that said platinum layer is disposed between said first layer and said titanium layer.

42. A cantilever according to claim 35, further comprising a silicon layer located on said first electrode so that said first electrode is disposed between said first layer and said silicon layer; wherein said first electrode comprises:
   a platinum layer formed on said first layer; and
   a tantalum layer located on said platinum layer so that said platinum layer is disposed between said first layer and said tantalum layer.

43. A cantilever according to claim 35, wherein said first layer is crystallographically oriented.

44. A cantilever having a first end portion having a pointed portion, a second end portion, and a plate which can be deflected in a direction of the thickness thereof and which is located between said first end portion and said second end portion, wherein said plate comprises:
   a first layer made of piezoelectric crystal;
   a first electrode for vibrating said plate, being attached to said first layer; and
   a second electrode for detecting a strain of said plate, being attached to said first layer.

45. A cantilever according to claim 44, wherein an ac voltage is applied to said first electrode for vibrating the cantilever, and wherein an induced voltage due to an piezoelectric effect of said first layer is produced by the deflection of said plate, whereby said strain of said plate is detected by said second electrode.

46. A cantilever having a first end portion having a pointed portion, a second end portion, and a plate which can be deflected in a direction of the thickness thereof and which is located between the said first end portion and said second end portion, wherein said plate comprises:
   a first layer made of piezoelectric crystal, said first layer being comprised of material containing lead;
   a first insulator layer;
   a first electrode disposed between said first layer and said first insulator layer; and
   a buffer layer disposed between said first insulator layer and said first layer.

47. A cantilever according to claim 46, wherein said first insulator layer is silicon nitride.

48. A cantilever according to claim 46, wherein said first buffer layer is comprised of a material selected from the group consisting of aluminum oxide, magnesium oxide, and chromium oxide.

49. A cantilever according to claim 46, wherein said first electrode is comprised of a material containing platinum.

50. A cantilever having a probe which is brought closer to a measured sample, said cantilever comprising:
   a first layer made of piezoelectric crystal containing lead, wherein said first layer can be deflected in a direction of the thickness thereof, and wherein said first layer is attached to said probe;
   a first insulator layer;
   a first electrode disposed between said first layer and said first insulator layer; and
   a buffer layer disposed between said first insulator layer and said first layer.

51. A cantilever according to claim 50, wherein said first insulator layer is silicon nitride; said first buffer layer is comprised of a material selected from the group consisting of aluminum oxide, magnesium oxide, and chromium oxide; and wherein said first electrode is comprised of a material containing platinum.

52. A cantilever having a first end portion having a pointed portion, a second end portion, and a plate which can be deflected in a direction of the thickness thereof and which is located between the said first end portion and said second end portion, wherein said plate comprises:
   a silicon layer;
   a piezoelectric crystal layer; and
   a first electrode located between said piezoelectric crystal layer and said silicon layer, having a first layer comprised of titanium, and a second layer comprised of platinum, and
   a second electrode formed on said piezoelectric crystal layer.

53. A cantilever according to claim 52, wherein said first layer is in contact with said silicon layer; and wherein said second layer is disposed between said piezoelectric crystal layer and said first layer.

54. A cantilever having a probe which is brought closer to a measured sample, said cantilever comprising:
   a silicon layer;
   a piezoelectric crystal layer containing lead, wherein said piezoelectric crystal layer can be deflected in a direction of the thickness thereof, and wherein said piezoelectric crystal layer is attached to said probe;
   a first electrode located between said piezoelectric crystal layer and said silicon layer, having a first layer comprised of titanium, and a second layer comprised of platinum, and
   a second electrode formed on said piezoelectric crystal layer.

55. A cantilever according to claim 54, wherein said first layer is in contact with said silicon layer; and wherein said second layer is disposed between said piezoelectric crystal layer and said first layer.

56. A cantilever having a first end portion having a pointed portion, a second end portion, and a plate which can be deflected in a direction of the thickness thereof and which is located between the said first end portion and said second end portion, wherein said plate comprises:
   a silicon layer;

a piezoelectric crystal layer; and a first electrode located between said piezoelectric crystal layer and said silicon layer, having a first layer comprised of tantalum, and a second layer comprised of platinum, and a second electrode formed on said piezoelectric crystal layer.

57. A cantilever according to claim 56, wherein said first layer is in contact with said silicon layer; and wherein said second layer is disposed between said piezoelectric crystal layer and said first layer.

58. A cantilever having a first end portion having a pointed portion, a second end portion, and a plate which can be deflected in a direction of the thickness thereof and which is located between said first end portion and said second end portion, where said plate comprises:

a first layer made of piezoelectric crystal, wherein said first layer is crystallographically oriented;

a first electrode attached to said first layer; and a second electrode attached to said first layer.

59. A cantilever having a probe which is brought closer to a measured sample, said cantilever comprising:

a first layer made of piezoelectric crystal, wherein said first layer can be deflected in a direction of the thickness thereof, wherein said first layer is attached to said probe, and wherein said first layer is crystallographically oriented;

a first electrode attached to said first layer; and a second electrode attached to said first layer.

* * * * *